United States Patent [19]
Takahashi

[11] Patent Number: 5,861,997
[45] Date of Patent: Jan. 19, 1999

[54] CATADIOPTRIC REDUCTION PROJECTION OPTICAL SYSTEM AND EXPOSURE APPARATUS HAVING THE SAME

[75] Inventor: Tomowaki Takahashi, Yokohama, Japan

[73] Assignee: Nikon Corporation, Tokyo, Japan

[21] Appl. No.: 515,631

[22] Filed: Aug. 16, 1995

[30] Foreign Application Priority Data

Aug. 23, 1994 [JP] Japan .................................. 6-198350

[51] Int. Cl.$^6$ .................................................. G02R 27/00
[52] U.S. Cl. ........................................... 359/727; 359/720
[58] Field of Search ........................................ 359/70, 77

[56] References Cited

U.S. PATENT DOCUMENTS

| | | |
|---|---|---|
| 4,953,960 | 9/1990 | Williamson . |
| 5,089,913 | 2/1992 | Singh ..................................... 359/727 |
| 5,220,454 | 6/1993 | Ichihara et al. . |
| 5,241,423 | 8/1993 | Chiu et al. .............................. 359/727 |
| 5,402,267 | 3/1995 | Fürter et al. . |

Primary Examiner—Georgia Y. Epps
Assistant Examiner—Thomas Robbins
Attorney, Agent, or Firm—Pennie & Edmonds

[57] ABSTRACT

A catadioptric projection optical system is provided, which can use a beam splitting optical system smaller in size than a conventional polarizing beam splitter, can set a long optical path from a concave reflecting mirror to an image plane, allows easy adjustment of the optical system, and has excellent imaging performance. A light beam from an object surface forms a first intermediate image through a refracting lens group. A light beam from the first intermediate image passes through a polarizing beam splitter and is reflected by a concave reflecting mirror to form a second intermediate image in the polarizing beam splitter. A light beam from the second intermediate image is reflected by the polarizing beam splitter means to form a final image on the image plane via a refracting lens group. The polarizing beam splitter means is arranged near the positions at which the intermediate images are formed.

14 Claims, 13 Drawing Sheets

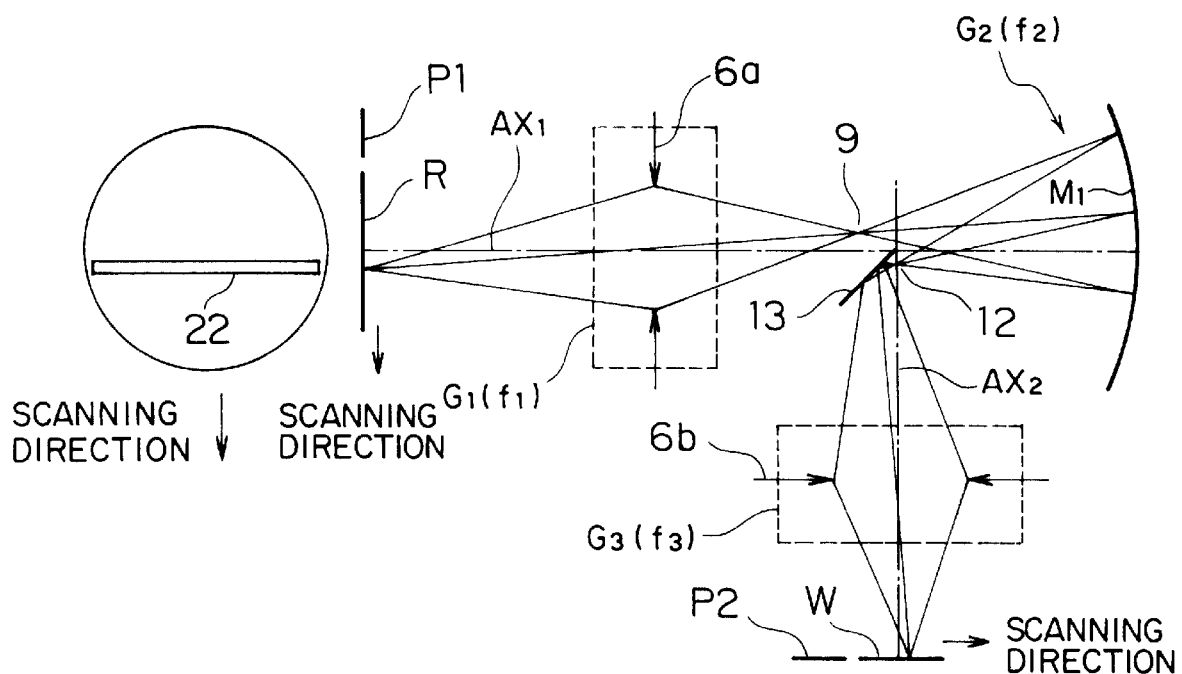

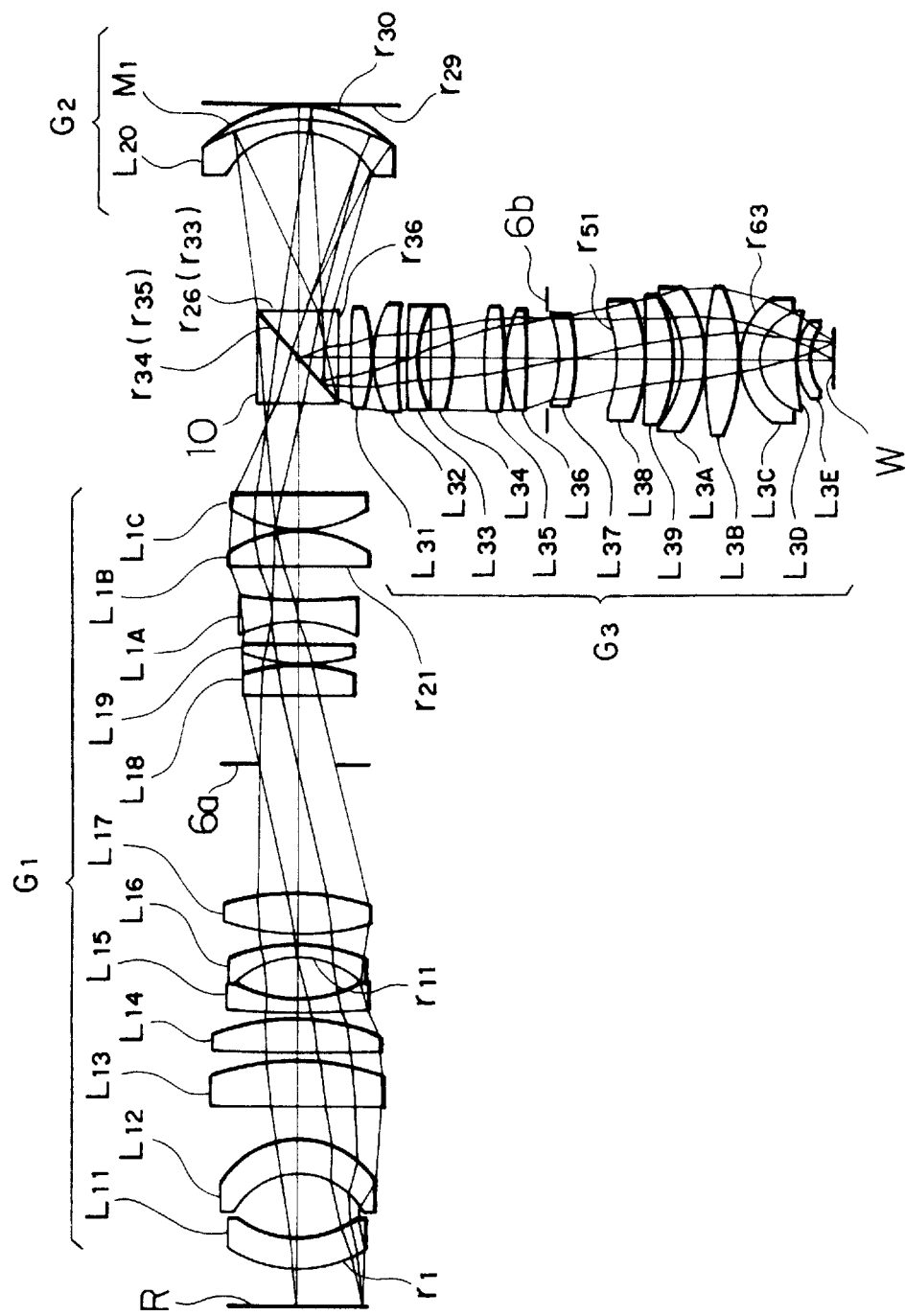

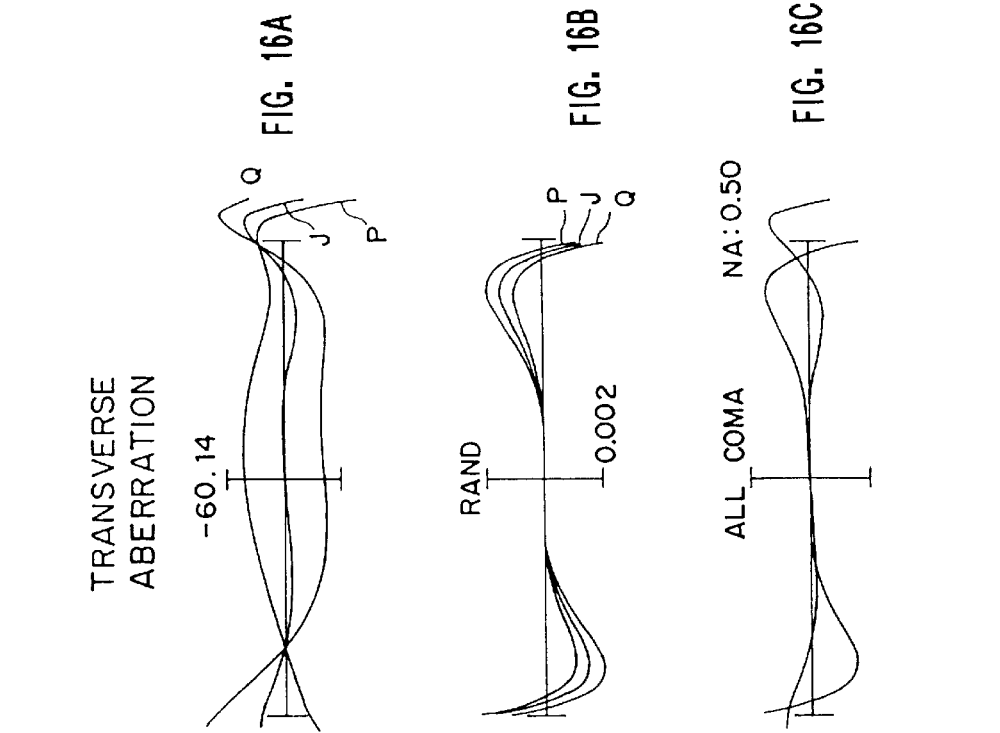
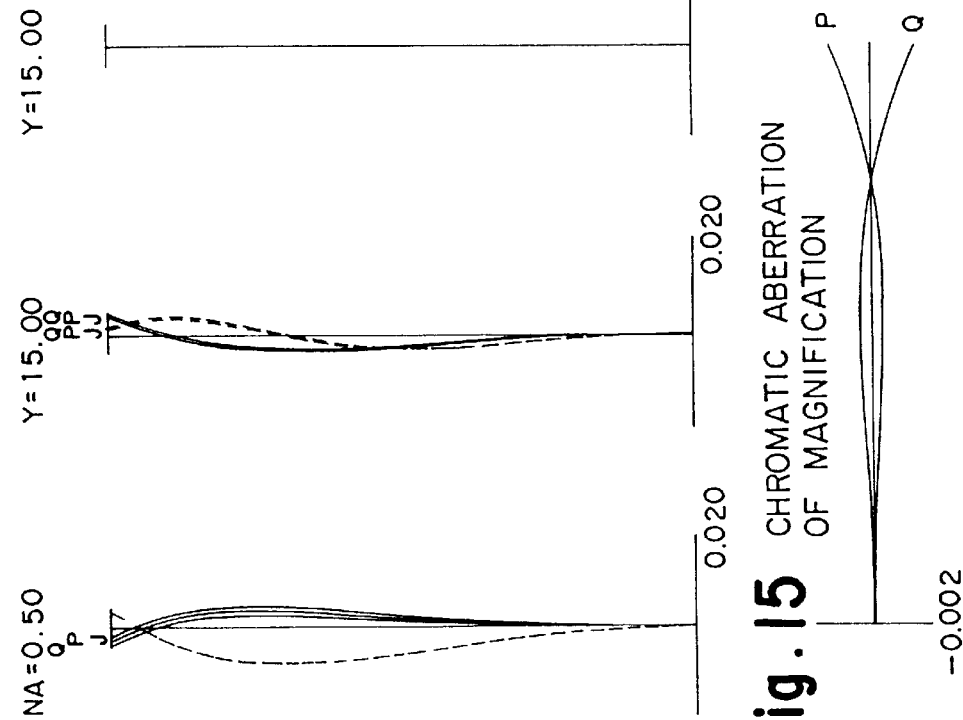
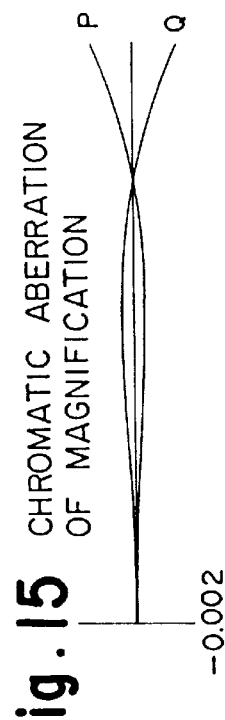

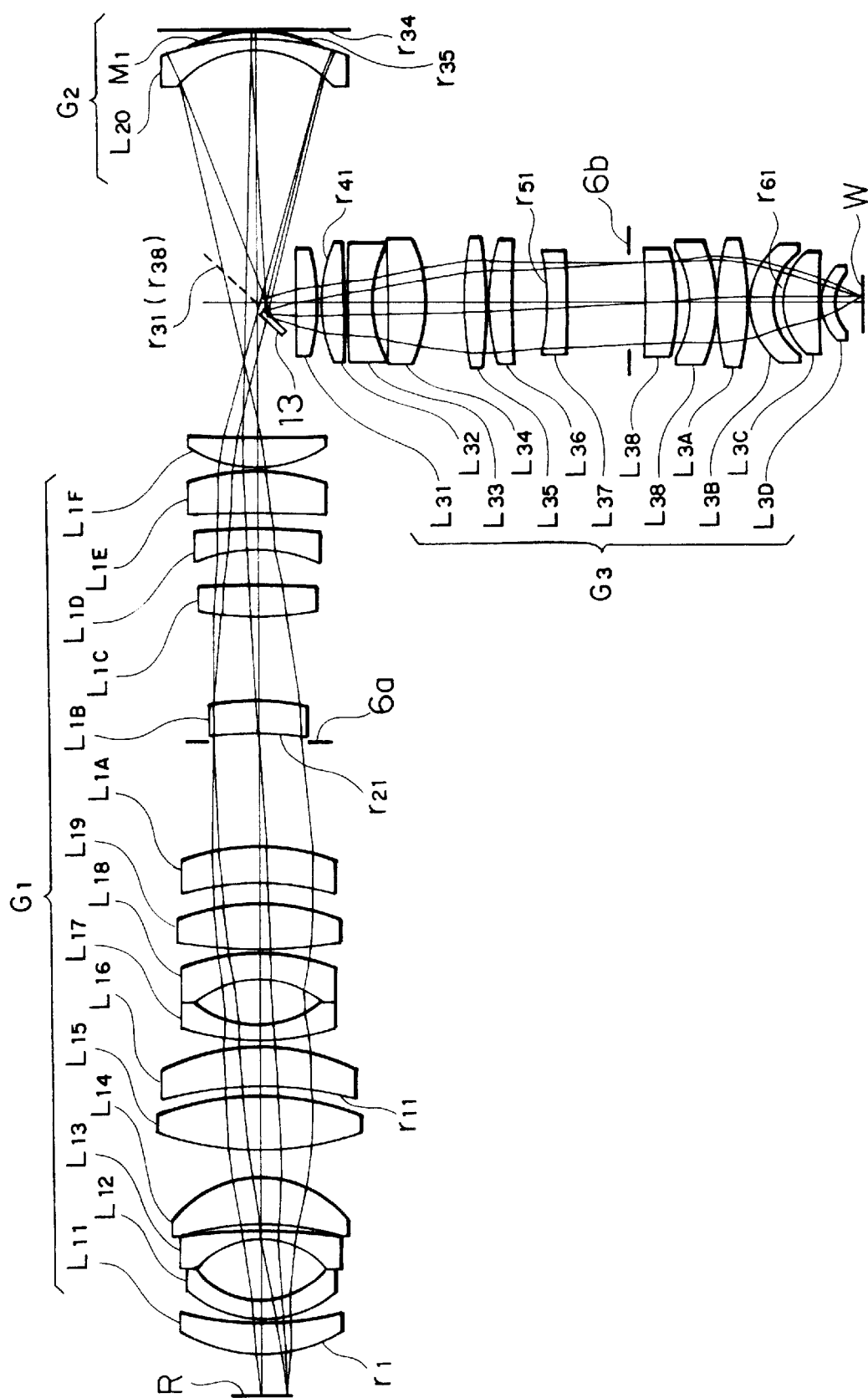

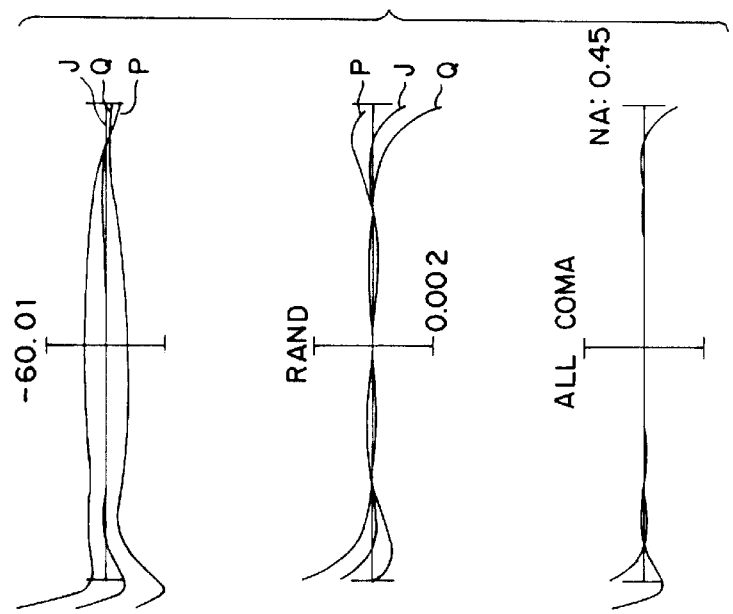
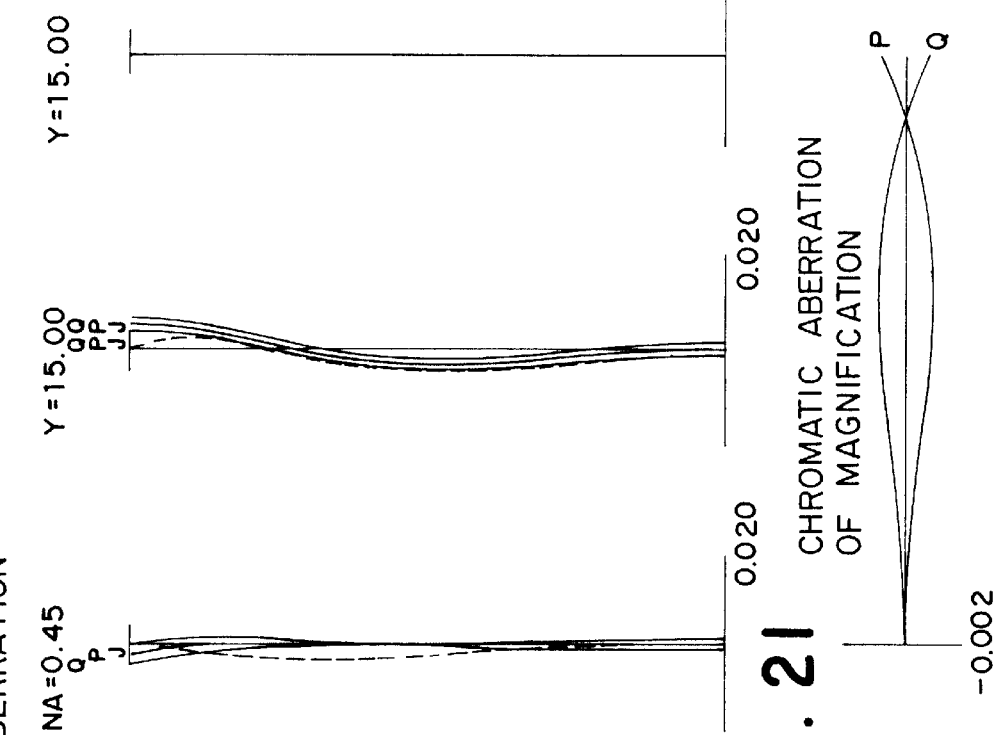

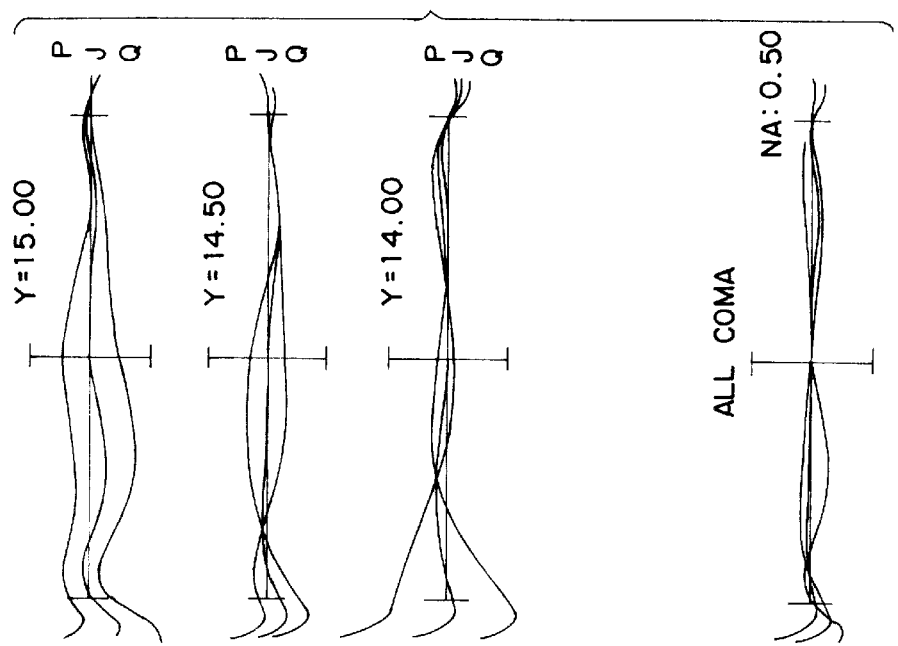
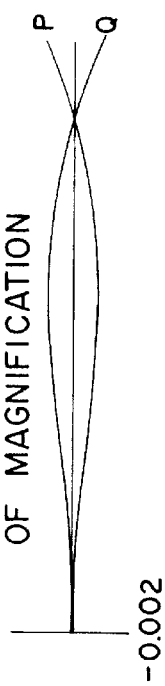

CATADIOPTRIC REDUCTION PROJECTION OPTICAL SYSTEM AND EXPOSURE APPARATUS HAVING THE SAME

BACKGROUND OF THE INVENTION

1. Field of the Invention

The present invention relates to a catadioptric reduction optical system suitably applied to a projection optical system for reduction projection in a projection exposure apparatus of a one-shot exposure method or a scanning exposure method, used to manufacture a semiconductor element or a liquid crystal display element in a photolithographic process and, more particularly, to a catadioptric reduction projection optical system having a magnification of about 1/4 to 1/5 with a resolution on the submicron order in the ultraviolet wavelength range.

2. Related Background Art

In fabricating semiconductor devices or liquid crystal display devices, etc. by photolithography process, the projection exposure apparatus is used for demagnifying through a projection optical system a pattern image on a reticle (or photomask, etc.) for example at a ratio of about 1/4 to 1/5 to effect exposure of the image on a wafer (or glass plate, etc.) coated with a photoresist and the like.

With the recent increase in the integration degree of semiconductor elements and the like, a higher resolution is required for a projection optical system used in a projection exposure apparatus. In order to meet this requirement, the wavelength of illumination light (exposure wavelength) for exposure must be shortened, or the numerical aperture (NA) of the projection optical system must be increased. If, however, the exposure wavelength is shortened, the types of optical glass which can be used in practice are limited because of the absorption of illumination light. In particular, as the exposure wavelength becomes 300 nm or less, only synthetic quartz and fluorite can be used in practice as glass materials.

The difference between the Abbe constants of the synthetic quartz and the fluorite is not large enough to correct chromatic aberration. For this reason, if the exposure wavelength becomes 300 nm or less, and a projection optical system is constituted by only a refracting optical system, chromatic aberration correction is very difficult to perform. In addition, since fluorite undergoes a considerable change in refractive index with a change in temperature, i.e., has poor temperature characteristics, and involves many problems in a lens polishing process, fluorite cannot be used for many portions. It is, therefore, very difficult to form a projection optical system having a required solution by using only a refracting system.

In contrast to this, attempts have been made to form a projection optical system by using only a reflecting system. In this case, however, the projection optical system increases in size and requires aspherical reflecting surfaces. It is very difficult to manufacture large, high-precision, aspherical surfaces Under the circumstances, various techniques have been proposed to form a reduction projection optical system by using a so-called catadioptric optical system constituted by a combination of a reflecting system and a refracting system consisting of optical glass usable in relating to the exposure wavelength to be used. As an example, a reduction projection exposure apparatus including a catadioptric projection optical system having a beam splitter constituted by a cubic prism and serving to project a reticle image entirely by using a light beam near the optical axis is disclosed in, e.g., U.S. Pat. Nos. 4,953,960, 5,220,454, 5,089,913, or 5,402,267.

SUMMARY OF THE INVENTION

The present invention has as its object to provide a catadioptric reduction projection optical system which can use a beam splitting optical system smaller in size than a conventional polarizing beam splitter, can set a long optical path from a concave reflecting mirror to the image plane, can easily adjust the optical system, and has excellent imaging performance.

It is another object of the present invention to provide a catadioptric reduction projection optical system which can reduce the size of a beam splitting optical system such as a polarizing beam splitter and still has a space in which an aperture stop can be arranged.

It is still another object of the present invention to provide a catadioptric reduction projection optical system which uses a compact beam splitting optical system and can be applied to a projection optical apparatus of the scanning exposure scheme.

The catadioptric reduction projection optical system can be applied to a projection exposure apparatus of a scanning exposure method, based on use of a compact beam splitting means such as a polarizing beam splitter and the like. Besides a projection exposure apparatus of a one-shot exposure method, the catadioptric reduction projection optical system can be also applied to a recent apparatus employing a scanning exposure method such as the slit scan method or the step-and-scan method, etc. for effecting exposure while relatively scanning a reticle and a wafer to a projection optical system.

To achieve the above objects, as shown in FIGS. 1 and 2, an projection exposure apparatus of the present invention comprises at least a wafer stage 3 being movable and allowing photosensitive substrate W to be held on a main surface thereof, an illumination optical system 1 for emitting exposure light of a predetermined wavelength and transferring a predetermined pattern of a mask (reticle R) onto the substrate W, and a catadioptric reduction projection optical system 5 provided between a first surface P1 on which the mask R is disposed and a second surface P2 on which a surface of the substrate W is corresponded, for projecting an image of the pattern of the mask R onto the substrate W. The illumination optical system 1 includes an alignment optical system 110 for adjusting a relative positions between the mask R and the substrate W, and the mask R is disposed on a reticle stage 2 which is movable in parallel with respect to the main surface of the wafer stage 3. The catacioptric reduction projection optical system has a space permitting an aperture stop 6 to be set therein. The sensitive substrate W comprises a wafer 8 such as a silicon wafer or a glass plate, etc., and a photosensitive material 7 such as a photoresist and the like coating a surface of the wafer 8.

In particular, the catadioptric reduction projection optical system, as shown in FIGS. 3 and 4, includes at least a first imaging optical system having a focal length $f_1$ (refracting lens group $G_1(f_1)$) having a positive refractive power and for forming a first intermediate image 9 as a reduced image of the pattern on the object plane P1, beam splitting means 10 for splitting at least part of a light beam from the first imaging optical system, a second imaging optical system having a focal length $f_2$ (catadioptric lens group $G_2(f_2)$) including a concave reflecting mirror $M_1$ for reflecting a light beam split by the beam splitting means, and for forming a second intermediate image 12 as an image of the first intermediate image 9, and a third imaging optical system having a focal length $f_3$ (refracting lens group $G_3(f_3)$) for forming a third intermediate image (a final image) as an image of the second intermediate image 12 on the image plane P2 on the basis of a light beam, of a light beam from the second imaging optical system, which is split by the beam splitting means 10.

Since the first imaging optical system $G_1(f_1)$ forms a first reduced intermediate image in an optical path from the image plane P1 to the concave reflecting mirror $M_1$ (or $M_2$), the beam splitting means can exactly carry out the splitting of a light beam from the first imaging optical system $G_1(f_1)$. Since the second imaging optical system $G_2(f_2)$ forms a second intermediate image in an optical path from the concave reflecting mirror $M_1$ (or $M_2$) to the third imaging optical system $G_3(f_3)$, a smaller beam splitting means can be used in the catadioptric reduction optical system of the present invention. Additionally, as shown in FIGS. 3 and 4, the second imaging optical system $G_2(f_2)$ can be used the concave reflecting mirror $M_1$ so that the mirror $M_1$ sandwiches the beam splitter 10 with the first imaging optical system $G_1(f_1)$ and, also can be used the concave reflecting mirror $M_2$ so that the mirror $M_2$ sandwiches the beam splitter 10 with the third imaging optical system $G_3(f_3)$.

If the beam splitting means is a prism type beam splitter 10, at least one of the first and second intermediate images 9, 12 is preferably formed in the prism type beam splitter.

If the beam splitting means is a partial reflecting mirror 13 for partially reflecting a light beam from the first imaging optical system (refracting lens group $G_1(f_1)$) as shown in FIG. 5, the second intermediate image 12 is preferably formed in an optical path form the first imaging optical system to the concave reflecting mirror $M_1$ of the second imaging optical system and is located at the concave reflecting mirror side of the partial reflecting mirror 13. In other words, the intermediate image 12 is formed between the concave reflecting mirror $M_1$ and the partial reflecting mirror 13.

In addition, the following inequalities are preferably satisfied:

$$p_1 + p_3 > 0 \quad (1)$$

$$p_2 < 0 \quad (2)$$

$$|p_1 + p_2 + p_3| < 0.1 \quad (3)$$

where $p_1$, $p_2$, and $p_3$ are the Petzval sums of the first imaging optical system (refracting lens group $G_1(f_1)$), the second imaging optical system (catadioptric lens group $G_2(f_2)$), and the third imaging optical system (refracting lens group $G_3(f_3)$), respectively.

Furthermore, the following relations are preferably satisfied:

$$0.1 \leq |\beta_1| \leq 1 \quad (4)$$

$$0.5 \leq |\beta_2| \leq 2 \quad (5)$$

$$0.25 \leq |\beta_3| \leq 1.5 \quad (6)$$

$$|\beta_1 \cdot \beta_2 \cdot \beta_3| \leq 1 \quad (7)$$

where $\beta_1$ is the magnification between the pattern of the first surface and the first intermediate image, $\beta_2$ is the magnification between the first intermediate image and the second intermediate image, and $\beta_3$ is the magnification between the second intermediate image and the third intermediate image.

According to the catadioptric reduction projection optical system of the present invention, when the polarizing beam splitter 10 (PBS) is used as a beam splitting means as shown in FIGS. 3 and 4, the system is suitable for the one-shot exposure method even though the system can be applied to the scanning exposure method. In this case, a light beam incident on the second imaging optical system (catadioptric lens group $G_2(f_2)$) and a light beam reflected thereby are split by the polarizing beam splitter 10 to be guided to the subsequent optical system. In addition, the polarizing beam splitter 10 is arranged near the position where the light beam is focused as the second intermediate image 12 after the first intermediate image 9 is formed, i.e., the portion where the light beams is intensively focused. Therefore, the polarizing beam splitter 10 can be reduced in size. In addition, the blanket wafer exposure scheme can be employed unlike a so-called ring field optical system for exposing only an annular zone by using an off-axis beam.

In addition, by using a light beam from the second intermediate image 12, an image can be formed again on the second surface P2 by the third imaging optical system (refracting lens group $G_3(f_3)$). For this reason, the working distance from, e.g., a wafer placed on the second surface to the third imaging optical system ($G_3(f_3)$) can be set to be long. In addition, since an aperture stop 6 can be easily arranged in the third imaging optical system ($G_3(f_3)$), the coherent factor (σ value) as the ratio between the numerical aperture of the illumination optical system and that of the projection optical system can be controlled in a wide range, thereby controlling the imaging characteristics.

Theoretically, the number of lenses of the third imaging optical system ($G_3(f_3)$) can be increased infinitely. For this reason, the numerical aperture (NA) of the projection optical system can be increased. That is, a bright optical system can be obtained.

In a general reflecting optical system, an optical path must always be deflected at a given position in the optical system. The precision in decentering the optical axis at the deflected portion is strict, posing serious problems in the manufacture of the optical system. In the present invention, however, if, for example, the optical path of a light beam from the second imaging optical system ($G_2(f_2)$) is deflected by the polarizing beam splitter 10, decentering of an optical system constituted by the first and second imaging optical systems ($G_1(f_1)$, $G_2(f_2)$) and decentering of the third imaging optical system ($G_3$) can be independently adjusted. Thereafter, a structure for combining the two optical systems at a right angle can be employed. Therefore, decentering adjustment and the like are theoretically facilitated.

With regard to this point, according to the present invention, since the polarizing beam splitter 10 is arranged near the first intermediate image 9 or the second intermediate image 12 having a relatively low decentering sensitivity, even if decentering occurs in deflecting the optical path, the influence of this decentering on the optical performance is small.

In addition, as shown in FIGS. 3 and 4, even if, for example, a wafer w is horizontally placed on the second surface P2, since, for example, a reticle on the first surface P1 and the first imaging optical system ($G_1(f_1)$) can be horizontally arranged, the overall projection optical system can be set to be lower in height than a conventional projection optical system constituted by a refracting lens system. That is, the vertical dimension can be reduced. In other words, since there is a good vertical dimension margin, the optical system can be arranged with a good margin.

In order to reduce the light amount loss in the polarizing beam splitter 10, it is preferable that a prism type beam splitter 10 be used as a polarizing beam splitter, and a λ/4 plate 11 be inserted between the polarizing beam splitter and a concave reflecting mirror $M_1$, as shown in, e.g., FIGS. 3 and 4. With this arrangement, most of light reflected by the concave reflecting mirror $M_1$ is guided to the third imaging optical system $(G_3(f_3))$ via the polarizing beam splitter 10.

As shown in FIG. 5, when a partial mirror 13 is used as a beam splitting means, the basic function is almost the same as that in the case wherein the prism type beam splitter 10 is used. When the mirror 13 is used, since almost 100% of an imaging light beam can be used, occurrence of flare is suppressed. However, when the mirror 13 is used, since off-axis light offset from the optical axis is mainly used, a slit-shaped area 24 offset from the optical axis on the second surface P2 becomes an exposure field, as shown in FIGS. 5–7. Therefore, in using the mirror 13, in order to expose the pattern formed on the entire surface of a reticle R placed on the first surface P1 onto a wafer W, the reticle R and the wafer W must be scanned at a speed corresponding to the selected projection magnification. That is, exposure must be performed with the scanning exposure method.

When the small mirror 13 is used, a light beam from an annular zone offset from the axis can be used, as shown in FIGS. 8–10. In this case, the optical performance can be improved because the optical performance with respect to a portion of an image plane P2 need only be considered. Note that when the reticle R is also placed on a horizontal plane in a scheme of scanning both the reticle R and the wafer W, a mirror or the like may be arranged in the first imaging optical system $(G_1(f_1))$ to steer the optical path.

In addition, by imparting a slight field angle to, e.g., the partial reflecting mirror 13 in FIG. 5, the optical path can be split. That is, since a large field angle is not required to split the optical path, there is a good imaging performance margin as well. With regard to this point, in the conventional catadioptric projection optical system, for example, a maximum field angle of about 20° or more is required to split the optical path. In contrast to this, a light beam incident on the mirror in the present invention exhibits a field angle of about 10°, and hence aberration correction is facilitated.

A so-called ring field optical system is known as a projection optical system for the scanning exposure method, and the ring field optical system is constructed to illuminate only an off-axis annular portion. It is, however, difficult for the ring field optical system to have a large numerical aperture, because it uses an off-axis beam. Further, because optical members in that system are not symmetric with respect to the optical axis, processing, inspection, and adjustment of the optical members are difficult, and accuracy control or accuracy maintenance is also difficult. In contrast with it, because the angle of view is not large in the present invention, the optical system is constructed in a structure with less eclipse of beam.

In the present invention, in order to improve the performance of an optical system, the Petzval sum of the overall optical system must be set to be near 0. For this purpose, inequalities (1) to (3) above are preferably satisfied.

By satisfying inequalities (1) to (3) above, the curvature of field, which is associated with the optical performance, is suppressed to improve the flatness of the image plane. The image plane is curved toward the object plane P1 in a concave form beyond the upper limit of inequality (3) $(p_1+p_2+p_3 \geq 0.1)$, and is curved toward the object plane P1 in a convex form below the lower limit of inequality (3) $(p_1+p_2+p_3 \leq -0.1)$. As a result, the imaging performance considerably deteriorates.

When part of an off-axis imaging light beam is to be used, i.e., ring field illumination is to be performed, the Petzval conditions represented by inequalities (1) to (3) above need not always be satisfied. That is, even if the image plane is curved, no problems are posed as long as the optical performance with respect to part of the image height is good.

When relations (4) to (7) associated with the first to third imaging magnifications $\beta_1$ to $\beta_3$ are satisfied, an optical system can be easily arranged. Below the lower limits of relations (4) to (6) above, the reduction ratio excessively increases. As a result, exposure in a wide range is difficult to perform. Beyond the upper limits of relations (4) to (6) above, the enlargement ratio excessively increases. The application of this optical system to a projection optical apparatus contradicts the essential purpose of reduction projection.

When relation (4) is satisfied, most of the reduction ratio of the overall optical system can be ensured by the first imaging optical system $(G_1(f_1))$. In this case, the prism type beam splitter 10 or the partial reflecting mirror 13, in particular, can be reduced in size.

In applying the present invention to an exposure apparatus, in order to prevent a change in magnification with variations in image plane, at which a wafer or the like is located, in the optical axis direction, a telecentric state is preferably ensured at least on the image plane side.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 5 to 7 are views showing the schematic arrangement, the exposure field, and the like of the second embodiment of the present invention;

FIG. 11 is an optical path diagram showing a projection optical system according to the first embodiment of the present invention;

FIGS. 12 to 15 and 16(a) to 16(c) are aberration charts in the first embodiment of FIG. 11;

FIG. 17 is an optical path diagram showing a projection optical system according to the second embodiment of the present invention;

FIGS. 18 to 21 and 22(a) to 22(c) are aberration charts in the second embodiment of FIG. 17;

FIGS. 24 to 26 and 27(a) to 27(d) are aberration charts in the third embodiment of FIG. 23.

DETAILED DESCRIPTION OF THE PREFERRED EMBODIMENTS

Figure 1:
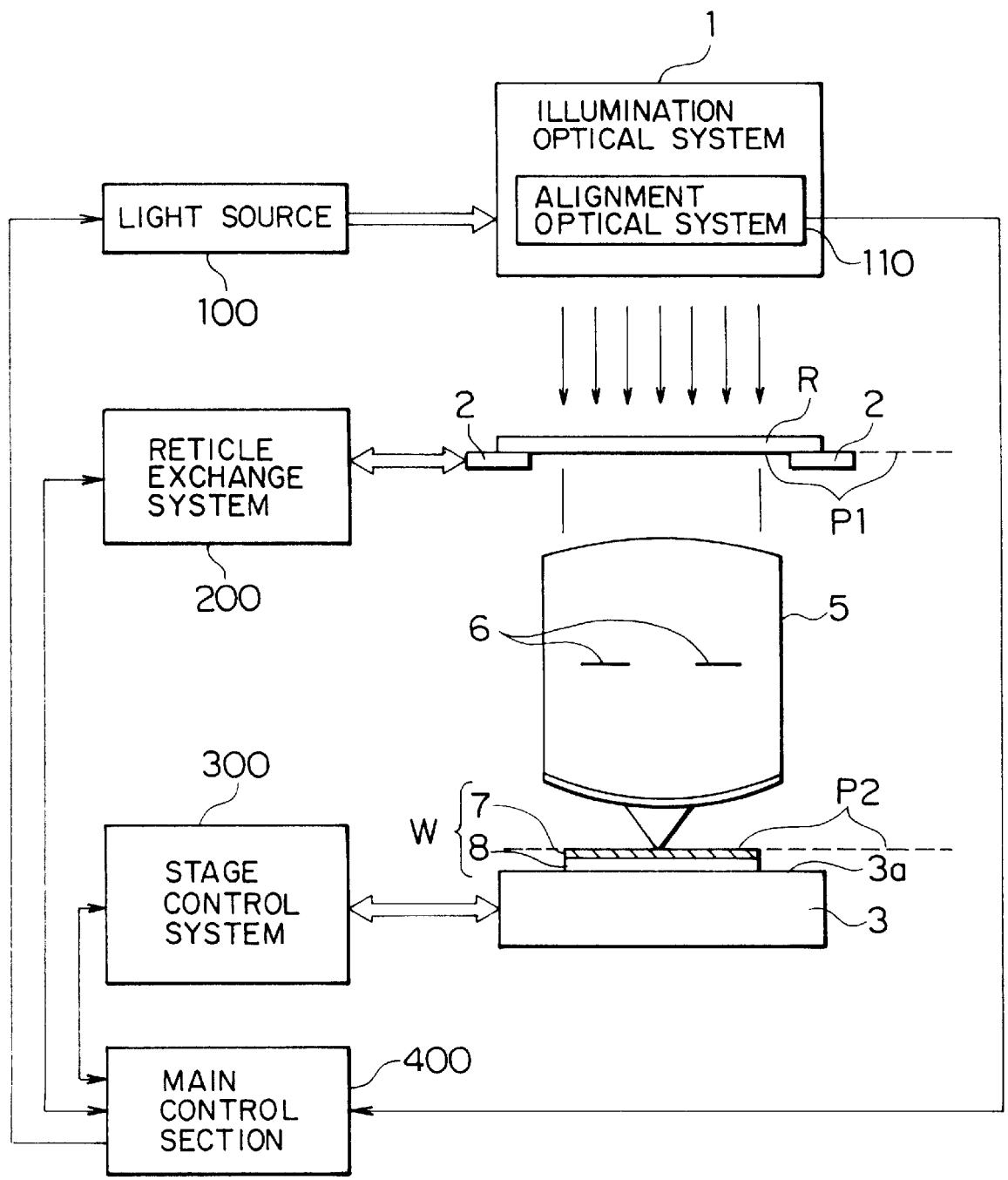
FIG. 1 is a structural drawing to show an exposure apparatus of a one-shot exposure method.

Various embodiments of the catadioptric reduction projection optical system according to the present invention will be described with reference to the drawings. In the examples, the optical system is applied to the projection optical system in the projection exposure apparatus for projecting a reduced image of patterns of reticle onto a wafer coated by a photoresist, using a one-shot exposure method or a scanning exposure method. FIG. 1 shows a basic structure of the exposure apparatus using a one-shot exposure method. As shown in FIG. 1, an exposure apparatus comprises at least a movable wafer-stage 3 allowing a photosensitive substrate W to be held on a main surface 3a thereof, an illumination optical system 1 for emitting exposure light of a predetermined wavelength and transferring a predetermined pattern of a mask (reticle R) onto the substrate W, a light source 100 for supplying an exposure light to the illumination optical system 1, a catadioptric reduction projection optical system 5 provided between a first surface P1 (object plane) on which the mask R is disposed and a second surface P2 (image plane) to which a surface of the substrate W is corresponded, for projecting an image of the pattern of the mask R onto the substrate W. The illumination optical system 1 includes an alignment optical system 110 for adjusting a relative positions between the mask R and the wafer W, and the mask R is disposed on a reticle stage 2 which is movable in parallel with respect to the main surface of the wafer stage 3. A reticle exchange system 200 conveys and changes a reticle (mask R) to be set on the reticle stage 2. The reticle exchange system 200 includes a stage driver for moving the reticle stage 2 in parallel with respect to the main surface 3a of the wafer stage 3. The catadioptric reduction projection optical system 5 has a space permitting an aperture stop 6 to be set therein. The sensitive substrate W comprises a wafer 8 such as a silicon wafer or a glass plate, etc., and a photosensitive material 7 such as a photoresist or the like coating a surface of the wafer 8. The wafer stage 3 is moved in parallel with respect to a object plane P1 by a stage control system 300. Further, since a main control section 400 such as a computer system controls the light source 100, the reticle exchange system 200, the stage control system 300 or the like, the exposure apparatus can perform a harmonious action as a whole.

Figure 2:
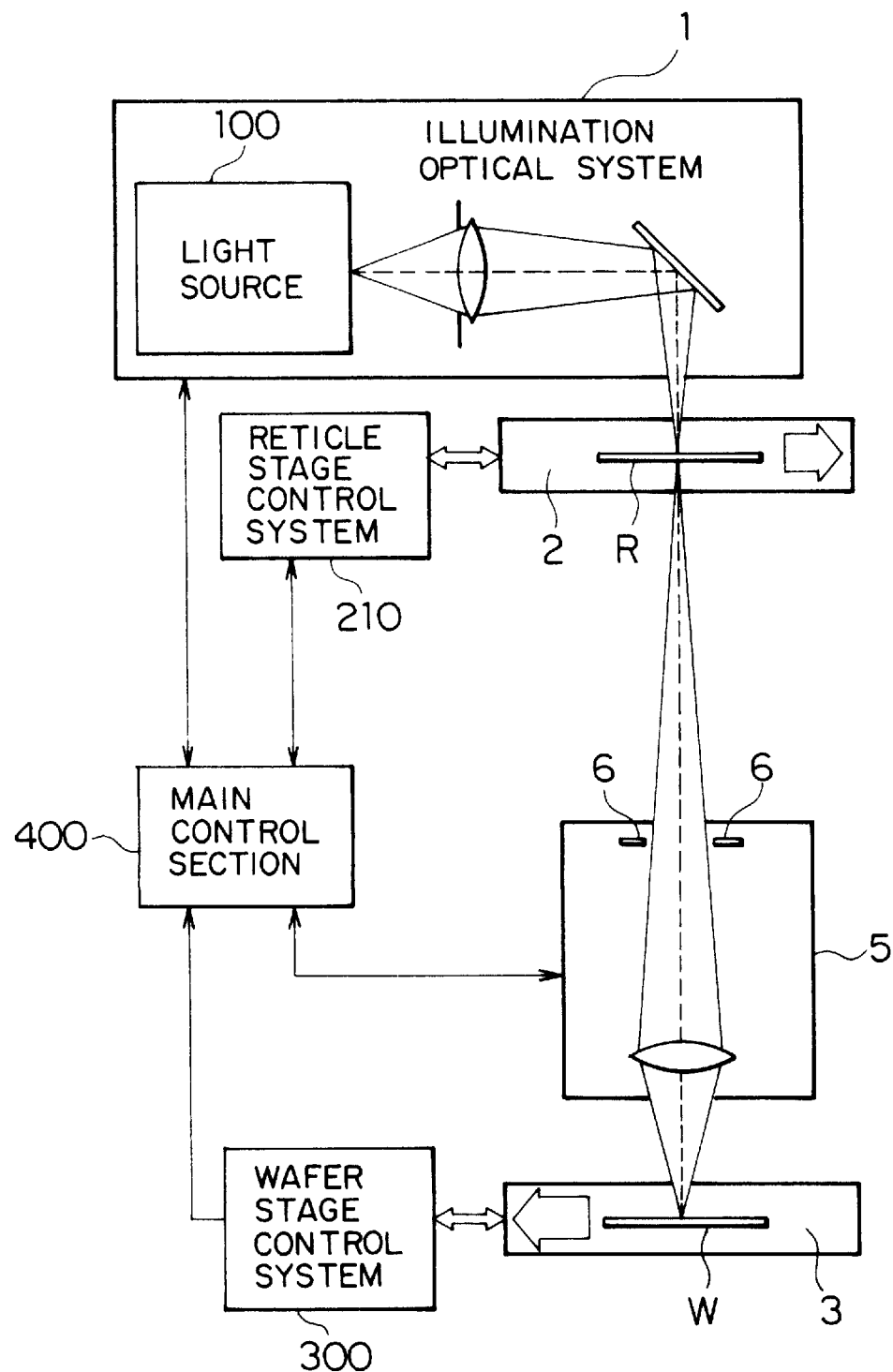
FIG. 2 is a structural drawing to show an exposure apparatus of a scanning exposure method.

FIG. 2 shows the basic structure of an exposure apparatus using a scanning exposure method. In FIG. 2, the exposure apparatus also comprises a wafer stage 3, a reticle stage 2, an illumination optical system 1, and a catadioptric reduction projection optical system 5. The illumination optical system 1 emits a light beam from the light source 100 to an illumination region on the reticle R, the illumination region being a predetermined shaped. The catadioptric reduction projection optical system 5 projects a reduced image of a pattern of the region on the reticle R to an exposure region on the wafer W (photosensitive substrate). The reticle stage control system 210 can move the reticle stage 2 with respect to the surface P2 of the wafer W and is included in the reticle exchange system 200. The main control section 400 such as a computer system controls the light source 100, the reticle exchange system 200. In particular, the main control section 400 separately controls the reticle stage control system 210 and the wafer stage control system 300 and, thereby can perform a scanning exposure method with changing a relative position between an illumination region on the reticle R and an exposure region on the wafer W.

The techniques relating to an exposure apparatus of the present invention are described, for example, in U.S. patent applications Ser. No. 255,927, No. 260,398, No. 299,305, U.S. Pat. No. 4,497,015, No. 4,666,273, No. 5,194,893, No. 5,253,110, No. 5,333,035, No. 5,365,051, No. 5,379,091, or the like. The reference of U.S. patent application Ser. No. 255,927 teaches an illumination optical system (using a laser source) applied to a scan type exposure apparatus. The reference of U.S. patent application Ser. No. 260,398 teaches an illumination optical system (using a lamp source) applied to a scan type exposure apparatus. The reference of U.S. patent application Ser. No. 299,305 teaches an alignment optical system applied to a scan type exposure apparatus. The reference of U.S. Pat. No. 4,497,015 teaches an illumination optical system (using a lamp source) applied to a scan type exposure apparatus. The reference of U.S. Pat. No. 4,666,273 teaches a step-and repeat type exposure apparatus capable of using the catadioptric projection optical system of the present invention. The reference of U.S. Pat. No. 5,194,893 teaches an illumination optical system, an illumination region, mask-side and reticle-side interferometers, a focusing optical system, alignment optical system, or the like. The reference of U.S. Pat. No. 5,253,110 teaches an illumination optical system (using a laser source) applied to a step-and-repeat type exposure apparatus. The '110 reference can be applied to a scan type exposure apparatus. The reference of U.S. Pat. No. 5,333,035 teaches an application of an illumination optical system applied to an exposure apparatus. The reference of U. S. Pat. No. 5,365,051 teaches a auto-focusing system applied to an exposure apparatus. The reference of U.S. Pat. No. 5,379,091 teaches an illumination optical system (using a laser source) applied to a scan type exposure apparatus.

Next, as described above, the optical system is applied to projection exposure apparatuses of a one-shot exposure method and a scanning exposure method, which are designed to project an image of a pattern on a reticle onto a wafer coated with a photoresist at a predetermined magnification.

With regard to the lens arrangement in each of the following embodiments, for example, as shown in FIG. 11, flat virtual planes (e.g., a plane $r_{29}$) are respectively used as the reflecting surface ($r_{30}$) and mirror surface of a concave reflecting mirror $M_1$. In order to express the shapes of lenses and the distances therebetween, the pattern surface of a reticle R is assumed to be the 0th plane, and each of the planes through which light emerging from the reticle R passes until it reaches a wafer W is sequentially assumed to be the ith plane (i=1, 2, . . . ), whereas the positive sign of the radius of curvature, $r_i$, of the ith plane indicates a convex lens with respect to a light beam from the reticle R. In addition, the plane distance between the ith plane and the (i+1)th plane is represented by $d_i$. $SiO_2$ represents fused quartz as a glass material. The fused quartz has the following refractive index with respect to the used reference wavelength (193 nm):

refractive index of fused quartz: 1.5610

First Embodiment

The first embodiment is a projection optical system suitable for a projection optical apparatus (e.g., a stepper) of a one-shot exposure method and having a magnification of 1/4×.

Figure 3:
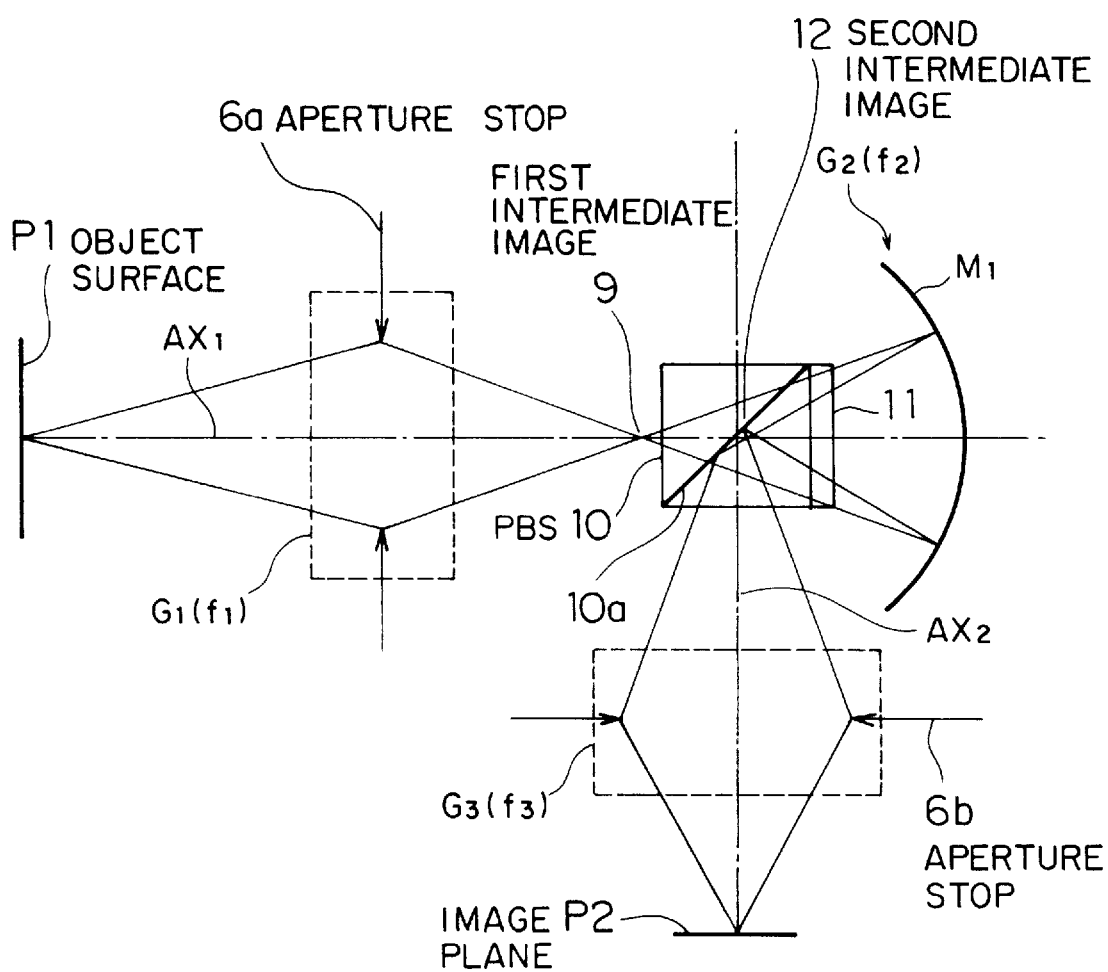
FIG. 3 is an optical path diagram showing the schematic arrangement of a catadioptric reduction projection optical system according to the first embodiment of the present invention.
Figure 4:
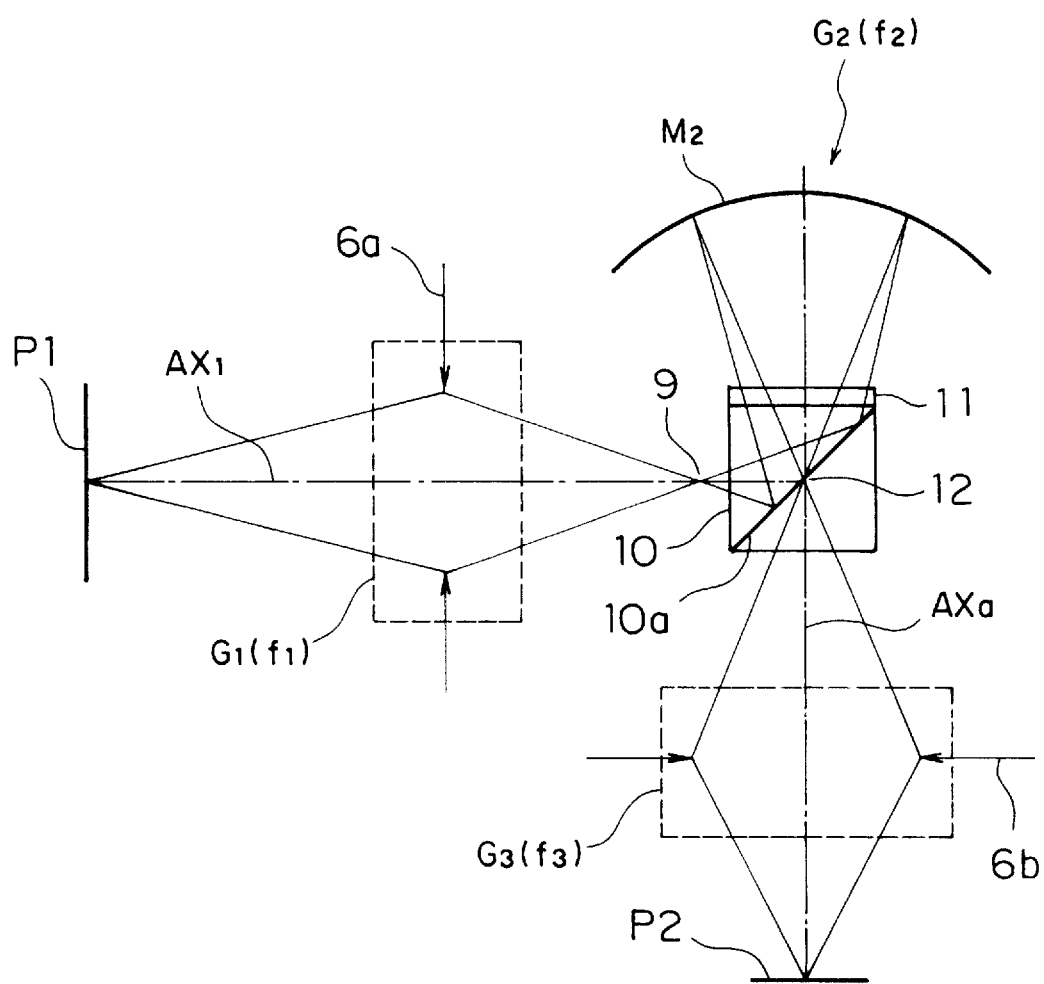
FIG. 4 is an optical path diagram showing a modification of the first embodiment.

FIGS. 3 and 4 show the overall arrangement of the first embodiment. Referring to FIGS. 3 and 4, a reticle R (see FIG. 11) on which a pattern to be transferred is drawn is placed on an object plane P1, and a wafer W (see FIG. 11) coated with a photoresist is placed on an image plane P2. The reticle R on the object plane P1 is illuminated with exposure illumination light from the light source 100 of the illumination optical system 1, and a light beam passing through the reticle R forms a first intermediate image 9 via a refracting lens group $G_1$ as a focusing lens group having a focal length $f_1$. A light beam from the first intermediate image 9 is incident on a polarizing beam splitter (PBS) 10. A p-polarized light beam transmitted through a polarizing/reflecting surface 10$a$ of the polarizing beam splitter 10 passes through $\lambda/4$ plate 11 and is reflected by a catadioptric lens group $G_2$, having a focal length $f_2$ and including a concave reflecting mirror $M_1$. Thereafter, the light beam returns as an s-polarized light beam to the polarizing beam splitter 10 via the $\lambda/4$ plate 11 to form a second intermediate image 12 in the polarizing beam splitter 10. Note that the catadioptric lens group $G_2(f_2)$ includes a refracting lens in practice, as shown in FIG. 11.

Most of the s-polarized light beam from the second intermediate image 12 is reflected by the polarizing/reflecting surface 10$a$ to form a reduced image of the reticle pattern onto the wafer W on the image plane P1 via a refracting lens group $G_3$ as a focusing lens group having a Focal length $f_3$. In addition, an aperture stop 6$a$ is arranged near the pupil plane of the refracting lens group $G_1(f_1)$ along an optical axis $AX_1$ of the refracting lens group $G_1(f_1)$, and an aperture stop 6$b$ is arranged near the pupil plane of the refracting lens group $G_3(f_3)$ along an optical axis $AX_2$ of the refracting lens group $G_3(f_3)$.

In this embodiment, since the second intermediate image 12 is formed to be closer to the concave reflecting mirror $M_1$ than the polarizing/reflecting surface 10$a$, the polarizing beam splitter 10, in particular, can be reduced in size.

FIG. 11 shows the detailed lens arrangement in the first embodiment of FIG. 3 (FIG. 4). The $\lambda/4$ plate 11 in FIG. 3 is omitted from the arrangement shown in FIG. 11.

As shown in FIG. 11, the refracting lens group $G_1(f_1)$ is constituted by in the following order from the reticle side: a negative meniscus lens $L_{11}$ having a convex surface facing the reticle R, a negative meniscus lens $L_{12}$ having a concave surface facing the reticle R, a biconvex lens (to be simply referred to as a convex lens hereinafter) $L_{13}$, a convex lens $L_{14}$, a negative meniscus lens $L_{15}$ having a convex surface facing the reticle R, a negative meniscus lens $L_{16}$ having a concave surface facing the reticle R, a convex lens $L_{17}$, a convex lens $L_{18}$, a convex lens $L_{19}$, a biconcave lens (to be simply referred to as a concave lens hereinafter) $L_{1A}$, a convex lens $L_{1B}$, and a convex lens $L_{1C}$. The catadioptric lens group $G_2(f_2)$ is constituted by a negative meniscus lens $L_{20}$ having a concave surface facing the reticle R and the concave reflecting mirror $M_1$.

The refracting lens group $G_3(f_3)$ is constituted by a convex lens $L_{31}$, a positive meniscus lens $L_{32}$ having a convex surface facing the reticle R (polarizing beam splitter 10), a negative meniscus lens $L_{33}$ having a convex surface facing the reticle R, a convex lens $L_{34}$, a convex lens $L_{35}$, a convex lens $L_{36}$, a negative meniscus lens $L_{37}$ having a concave surface facing the reticle R, a negative meniscus lens $L_{38}$ having a concave surface Facing the reticle R, a positive meniscus lens $L_{39}$ having a concave surface facing the reticle R, a negative meniscus lens $L_{3A}$ having a concave surface facing the reticle R, a convex lens $L_{3B}$, a negative meniscus lens $L_{3C}$ having a convex surface facing the reticle R. a positive meniscus lens $L_{3D}$ having a convex surface facing the reticle R, and a negative meniscus lens $L_{3E}$ having a convex surface facing the reticle R.

The aperture stop 6$a$ is arranged at the Fourier transform plane in the refracting lens group $G_1(f_1)$, i.e., between the convex lens $L_{17}$ and the convex lens $L_{18}$. The aperture stop 6$b$ is arranged at the Fourier transform plane in the refracting lens group $G_3(f_3)$, i.e., near the reticle-side surface of the negative meniscus lens $L_{37}$.

The reduction ratio of the overall system is 1/4×, the numerical aperture (NA) on the wafer side (image side) is 0.5, and the object height is 60 mm.

One type of optical glass consisting of fused quartz is used for all the refracting lenses. The system is corrected for axial chromatic aberration and for chromatic aberration of magnification with respect to a wavelength width of 1 nm in the wavelength (193 nm) of an ultraviolet excimer laser beam. In addition, spherical aberration, coma, astigmatism, and distortion are corrected to attain an almost aberration-free state, thereby realizing an optical system having excellent imaging performance.

The curvature radii $r_i$, plane distances $d_i$, and glass materials used in the first embodiment shown in FIG. 11 are shown in Table 1. In Table 1, the 29th and 34th planes are virtual planes indicating the polarizing/reflecting surfaces of the concave reflecting mirror $M_1$ and the polarizing beam splitter 10.

TABLE 1

| i | $r_i$ | $d_i$ | Glass Material | i | $r_i$ | $d_i$ | Glass Material |
|---|---|---|---|---|---|---|---|
| 0 | — | 34.6 | | 33 | ∞ | 41.2 | $SiO_2$ |
| 1 | 107.95 | 30.0 | $SiO_2$ | 34 | ∞ | 0.0 | |
| 2 | 93.49 | 60.0 | | 35 | ∞ | 41.2 | $SiO_2$ |
| 3 | −64.39 | 30.0 | $SiO_2$ | 36 | ∞ | 7.1 | |
| 4 | −80.34 | 31.2 | | 37 | 412.21 | 18.0 | $SiO_2$ |
| 5 | 1879.66 | 42.0 | $SiO_2$ | 38 | −151.48 | 3.0 | |
| 6 | −234.73 | 7.2 | | 39 | 90.81 | 24.0 | $SiO_2$ |
| 7 | 1112.81 | 30.0 | $SiO_2$ | 40 | 422.76 | 7.2 | |
| 8 | −209.18 | 6.0 | | 41 | 1244.69 | 9.0 | $SiO_2$ |
| 9 | 655.92 | 13.5 | $SiO_2$ | 42 | 90.94 | 12.0 | |
| 10 | 129.99 | 37.5 | | 43 | 753.18 | 19.2 | $SiO_2$ |
| 11 | −80.54 | 12.0 | $SiO_2$ | 44 | −187.50 | 29.7 | |
| 12 | −161.37 | 9.0 | | 45 | 318.30 | 18.0 | $SiO_2$ |
| 13 | 212.17 | 36.0 | $SiO_2$ | 46 | −383.26 | 3.0 | |
| 14 | −235.30 | 186.0 | | 47 | 167.48 | 18.0 | $SiO_2$ |
| 15 | 999.87 | 27.0 | $SiO_2$ | 48 | −2492.32 | 27.3 | |
| 16 | −175.63 | 3.0 | | 49 | −113.03 | 16.8 | $SiO_2$ |
| 17 | 203.15 | 18.0 | $SiO_2$ | 50 | −139.99 | 36.6 | |
| 18 | −3006.49 | 21.3 | | 51 | −125.26 | 24.6 | $SiO_2$ |
| 19 | −94.09 | 18.0 | $SiO_2$ | 52 | −135.38 | 1.5 | |
| 20 | 282.07 | 30.6 | | 53 | −454.54 | 24.6 | $SiO_2$ |
| 21 | 7834.80 | 33.0 | $SiO_2$ | 54 | −142.46 | 9.0 | |
| 22 | −111.27 | 3.0 | | 55 | −82.96 | 18.0 | $SiO_2$ |
| 23 | 103.80 | 30.0 | $SiO_2$ | 56 | −107.78 | 1.5 | |
| 24 | −6760.25 | 78.5 | | 57 | 394.38 | 30.0 | $SiO_2$ |
| 25 | ∞ | 82.5 | $SiO_2$ | 58 | −157.74 | 1.5 | |
| 26 | ∞ | 162.3 | | 59 | 63.96 | 17.1 | $SiO_2$ |
| 27 | −76.86 | 7.5 | $SiO_2$ | 60 | 47.02 | 3.0 | |
| 28 | −189.23 | 10.5 | | 61 | 47.29 | 30.0 | $SiO_2$ |
| 29 | ∞ | 0.0 | | 62 | 151.47 | 1.5 | |
| 20 | 126.03 | 10.5 | | 63 | 55.43 | 11.4 | $SiO_2$ |
| 31 | 189.23 | 7.5 | $SiO_2$ | 64 | 47.29 | 19.9 | |
| 32 | 76.86 | 162.3 | | | | | |

FIGS. 12 to 14 respectively show longitudinal aberration charts in the first embodiment; FIG. 12 shows a spherical aberration of this embodiment; FIG. 13 shows an astigmatism of this embodiment; and FIG. 14 shows a distortion of this embodiment. Further, FIG. 15 shows a magnification chromatic aberration chart in the first embodiment. FIGS. 16(a), 16(b) and 16(c) show transverse aberration charts in the first embodiment. In these aberration charts, reference symbols J, P, and Q respectively denote characteristic curves at the used reference wavelength (193 nm), 192.5 nm, and 193.5 nm.

The height of the projection optical system of this embodiment is mainly determined by the refracting lens group $G_3(f_3)$. The height of the refracting lens group $G_3(f_3)$ is about 600 mm at most. That is, the height of this system is about 1/2 that of a projection optical system constituted by a conventional refracting system.

In this embodiment, as shown in FIG. 3, of the light from the refracting lens group $G_1(f_1)$, a light beam which is transmitted through the polarizing beam splitter 10 is guided to the catadioptric lens group $G_2(f_2)$. As shown in FIG. 4, however, of the light from the refracting lens group $G_2(f_2)$, a light beam which is reflected by the polarizing beam splitter 10 may be guided to the catadioptric lens group $G_2(f_2)$ via the λ/4 plate 11. In this case, the light beam reflected by the concave reflecting mirror $M_2$ in the catadioptric lens group $G_2(f_2)$ is converted into a p-polarized light beam by the λ/4 plate 11 to form the second intermediate image 12 in the polarizing beam splitter 10. After most of the light beam from the second intermediate image 12 is transmitted through the polarizing/reflecting surface 10a, the light forms a reticle pattern image on the wafer W via the refracting lens group $G_3(f_3)$.

Second Embodiment

The second embodiment is a projection optical system suitable for a projection optical apparatus based on the scanning exposure scheme and having a magnification of 1/4×.

FIG. 5 shows the overall arrangement of the second embodiment. Referring to FIG. 5, a reticle R is placed on an object plane P1, and a wafer W is placed on an image plane P2. FIG. 6 is a plane view showing the reticle R when viewed in the direction of a refracting lens group $G_1(f_1)$ in FIG. 5. In this case, a bar-shaped illumination region 22, on the reticle R, which is slightly offset from the optical axis of the projection optical system is illuminated with illumination light from the light source 100 of the illumination optical system 1.

Referring to FIG. 5, a light beam passing through the illumination region 22 forms a first intermediate image 9 via the refracting lens group $G_1$, and a light beam from the first intermediate image 9 passes through a side surface of a mirror (to be referred to as a partial mirror hereinafter) 13 set at an angle of almost 45° with respect to an optical axis $AX_1$ to cover the lower half portion of the optical axis $AX_1$. The light beam is then reflected by a catadioptric lens group $G_2(f_2)$ including a concave reflecting mirror $M_1$ to form a second intermediate image 12 in front of the partial mirror 13. Note that the catadioptric lens group $G_2(f_2)$ includes a refracting lens in practice, as shown in FIG. 17.

A light beam from the second intermediate image 12 is reflected by the partial mirror 13 to form a reduced image of a reticle pattern on the wafer W on the image plane P2 via a refracting lens group $G_3(f_3)$. In addition, an aperture stop 6a is arranged near the pupil plane of the refracting lens group $G_1(f_1)$, and an aperture stop 6b is arranged near the pupil plane of the refracting lens group $G_3(f_3)$.

FIG. 7 is a plan view of the wafer W in FIG. 5. As shown in FIG. 5, the reduced image of the reticle pattern is projected onto a bar-shaped exposure region 24, on the wafer W, which is slightly offset from an optical axis $AX_2$. Therefore, in order to exposure the pattern on the entire surface of the reticle R, the wafer W may be scanned to the right (or the left) at a velocity $V_W (= \beta \cdot V_R)$ in synchronism with the downward (upward) scanning of the reticle R at a velocity $V_R$ in FIG. 5, provided that the magnification of the overall system is represented by β.

In this embodiment, since the second intermediate image 12 is formed at the concave reflecting mirror side of the partial mirror 13 and is located between the concave reflecting mirror $M_1$ and the partial mirror 13, the projection optical system can be reduced in size in the vertical direction in particular.

FIG. 17 shows the detailed lens arrangement in the second embodiment.

As shown in FIG. 17, the refracting lens group $G_1(f_1)$ is constituted by in the following order from the reticle side: a positive meniscus lens $L_{11}$ having a convex surface facing the reticle R, a negative meniscus lens $L_{12}$ having a convex surface facing the reticle R, a negative meniscus lens $L_{13}$ having a concave surface facing the reticle R, a positive meniscus lens $L_{14}$ having a concave surface facing the reticle R, a convex lens $L_{15}$, a positive meniscus lens $L_{16}$ having a concave surface facing the reticle R, a negative meniscus lens $L_{17}$ having a convex surface facing the reticle R, a negative meniscus lens $L_{18}$ having a concave surface facing the reticle R, a convex lens $L_{19}$, a positive meniscus lens $L_{1A}$ having a concave surface facing the reticle R, a positive meniscus lens $L_{1B}$ having a concave surface facing the reticle R, a convex lens $L_{1C}$, a negative meniscus lens $L_{1D}$ having a concave surface facing the reticle R, a positive meniscus lens $L_{1E}$ having a concave surface facing the reticle R, and a positive meniscus lens $L_{1F}$ having a convex surface facing the reticle R. The catadioptric lens group $G_2(f_2)$ is constituted by a negative meniscus lens $L_{20}$ having a concave surface facing the reticle R and the concave reflecting mirror $M_1$.

A refracting lens group $G_3(f_3)$ is constituted by a convex lens $L_{31}$, a convex lens $L_{32}$, a negative meniscus lens $L_{33}$ having a convex surface facing the reticle R (partial mirror 12), a positive meniscus lens $L_{34}$ having a concave surface facing the reticle R, a convex lens $L_{35}$, a positive meniscus lens $L_{36}$ having a convex surface facing the reticle R, a negative meniscus lens $L_{37}$ having a concave surface facing the reticle R, a positive meniscus lens $L_{38}$ having a concave surface facing the reticle R, a negative meniscus lens $L_{39}$ having a concave surface facing the reticle R, a convex lens $L_{3A}$, a negative meniscus lens $L_{3B}$ having a convex surface facing the reticle R, a positive meniscus lens $L_{3C}$ having a convex surface facing the reticle R, and a negative meniscus lens $L_{3D}$ having a convex surface facing the reticle R. The aperture stop 6a is arranged near the Fourier transform plane in the refracting lens group $G_1(f_1)$, i.e., at a plane near the positive meniscus lens $L_{1B}$ on the reticle R. The aperture stop 6b is arranged near the Fourier transform plane in the refracting lens group $G_3(f_3)$, i.e., a plane near the positive meniscus lens $L_{38}$ on the reticle R.

The reduction ratio of the overall system is 1/4×, the numerical aperture (NA) on the wafer W side (image side) is 0.45, and the object height is 60 mm.

One type of optical glass consisting of fused quartz is used for all the refracting lenses. The system is corrected for axial chromatic aberration and for chromatic aberration of magnification with respect to a wavelength width of 1 nm in the wavelength (193 nm) of an ultraviolet excimer laser beam. In addition, spherical aberration, coma, astigmatism, and distortion are corrected to attain an almost aberration-free state, thereby realizing an optical system having excellent imaging performance.

The curvature radii $r_i$, plane distances $d_i$, and glass materials used in the second embodiment shown in FIG. 17 are shown in Table 2. In Table 2, the 34th plane is a virtual plane indicating the reflecting surfaces of the concave reflecting mirror $M_1$.

TABLE 2

| i | $r_i$ | $d_i$ | Glass Material | i | $r_i$ | $d_i$ | Glass Material |
|---|---|---|---|---|---|---|---|
| 0 | — | 33.7 | | 33 | −200.63 | 5.1 | |
| 1 | 115.59 | 24.0 | SiO$_2$ | 34 | ∞ | 0.0 | |
| 2 | 206.01 | 3.0 | | 35 | 124.83 | 5.1 | |
| 3 | 82.23 | 15.0 | SiO$_2$ | 36 | 200.63 | 8.5 | SiO$_2$ |
| 4 | 64.61 | 51.0 | | 37 | 78.74 | 195.8 | |
| 5 | −65.23 | 6.0 | SiO$_2$ | 38 | ∞ | 30.0 | |
| 6 | −487.74 | 6.0 | | 39 | 4302.84 | 18.0 | SiO$_2$ |
| 7 | −187.92 | 36.0 | SiO$_2$ | 40 | −160.56 | 3.0 | |
| 8 | −85.94 | 24.0 | | 41 | 111.38 | 18.0 | SiO$_2$ |
| 9 | 256.51 | 42.0 | SiO$_2$ | 42 | −1676.43 | 3.0 | |
| 10 | −210.33 | 7.0 | | 43 | 977.92 | 21.0 | SiO$_2$ |
| 11 | −296.05 | 30.0 | SiO$_2$ | 44 | 102.28 | 12.0 | |
| 12 | −182.85 | 6.0 | | 45 | −988.64 | 28.2 | SiO$_2$ |
| 13 | 176.46 | 13.4 | SiO$_2$ | 46 | −117.27 | 30.4 | |
| 14 | 87.59 | 36.0 | | 47 | 251.58 | 18.0 | SiO$_2$ |
| 15 | −72.74 | 18.0 | SiO$_2$ | 48 | −351.71 | 3.0 | |
| 16 | −182.58 | 3.0 | | 49 | 186.32 | 18.0 | SiO$_2$ |
| 17 | 292.35 | 36.1 | SiO$_2$ | 50 | 731.15 | 27.0 | |
| 18 | −177.49 | 17.6 | | 51 | −205.32 | 16.8 | SiO$_2$ |
| 19 | −204.01 | 30.0 | SiO$_2$ | 52 | −482.46 | 60.5 | |
| 20 | −157.05 | 87.0 | | 53 | −481.92 | 24.7 | SiO$_2$ |
| 21 | −277.13 | 27.0 | SiO$_2$ | 54 | −142.39 | 9.0 | |
| 22 | −163.85 | 64.8 | | 55 | −92.11 | 20.2 | SiO$_2$ |
| 23 | 318.99 | 24.0 | SiO$_2$ | 56 | −133.33 | 1.5 | |
| 24 | −732.51 | 26.8 | | 57 | 207.89 | 24.0 | SiO$_2$ |
| 25 | −115.97 | 18.0 | SiO$_2$ | 58 | −204.01 | 1.5 | |
| 26 | −335.19 | 12.0 | | 59 | 60.36 | 17.1 | SiO$_2$ |
| 27 | −827.23 | 33.0 | SiO$_2$ | 60 | 49.08 | 9.0 | |
| 28 | −159.61 | 3.0 | | 61 | 55.94 | 27.0 | SiO$_2$ |
| 29 | 93.92 | 24.0 | SiO$_2$ | 62 | 420.19 | 1.5 | |
| 30 | 1239.44 | 105.0 | | 63 | 39.71 | 11.2 | SiO$_2$ |
| 31 | ∞ | 195.8 | | 64 | 36.46 | 21.0 | |
| 32 | −78.74 | 8.5 | SiO$_2$ | | | | |

FIGS. 18 to 20 respectively are longitudinal aberration charts in the second embodiment; FIG. 18 shows a spherical aberration of this embodiment; FIG. 19 shows an astigmatism of this embodiment; and FIG. 20 shows a distortion. Further, FIG. 21 shows a magnification chromatic aberration chart in the second embodiment. FIGS. 22(*a*), 22(*b*) and 22(*c*) show transverse aberration charts in the second embodiment.

Although the second embodiment exemplifies the scanning exposure apparatus, the present invention can be applied to a projection exposure apparatus of a one-shot exposure method.

Third Embodiment

The third embodiment is a projection optical system suitable for a projection exposure apparatus of a scanning exposure method and having a magnification of 1/4×. A partial mirror is used in the third embodiment like in the second embodiment. However, an off-axis light ray further offset from the optical axis than in the second embodiment is used in the third embodiment.

Figures 8, 9:
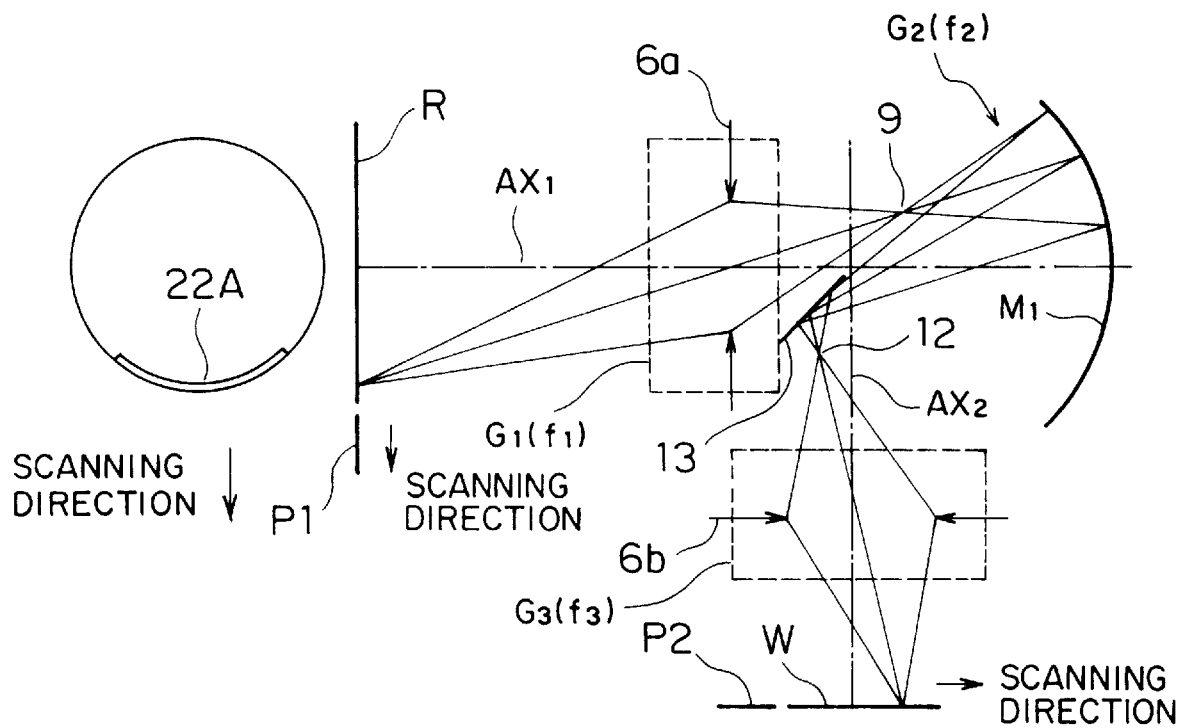
FIGS. 8 to 10 are views showing the schematic arrangement, the exposure field, and the like of the third embodiment of the present invention.

FIG. 8 shows the overall arrangement of the second embodiment. Referring to FIG. 8 which indicates similar or same parts with the same reference numerals as in FIG. 5, a reticle 21 is placed on an object plane P1, and a wafer W is placed on an image plane P2. FIG. 9 is a plane view showing the reticle R when viewed in the direction of a refracting lens group $G_1(f_1)$. As shown in FIG. 9, an arcuated illumination region 22A, on the reticle R, which is slightly offset from the optical axis of the projection optical system is illuminated.

Figure 10:
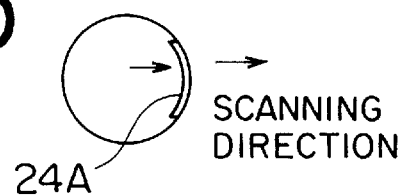

Referring to FIG. 8, a light beam passing through the illumination region 22A forms a reduced image of a reticle pattern on an exposure region 24A (see FIG. 10) on the wafer W through the refracting lens group $G_1(f_1)$, a catadioptric lens group $G_2(f_2)$ including a concave reflecting mirror $M_1$, a partial mirror 13, and a refracting lens group $G_3(f_3)$. In this case, in order to expose the pattern on the entire surface of the reticle R onto the wafer W, the wafer W may be scanned to the right (or the left) in synchronism with the downward (or upward) scanning of the reticle R in FIG. 9.

In this embodiment, a second intermediate image 12 is formed at the reflecting lens group side of the partial mirror 13 and is located between the refracting lens group $G_3(f_3)$ and the mirror 13.

Figure 23:
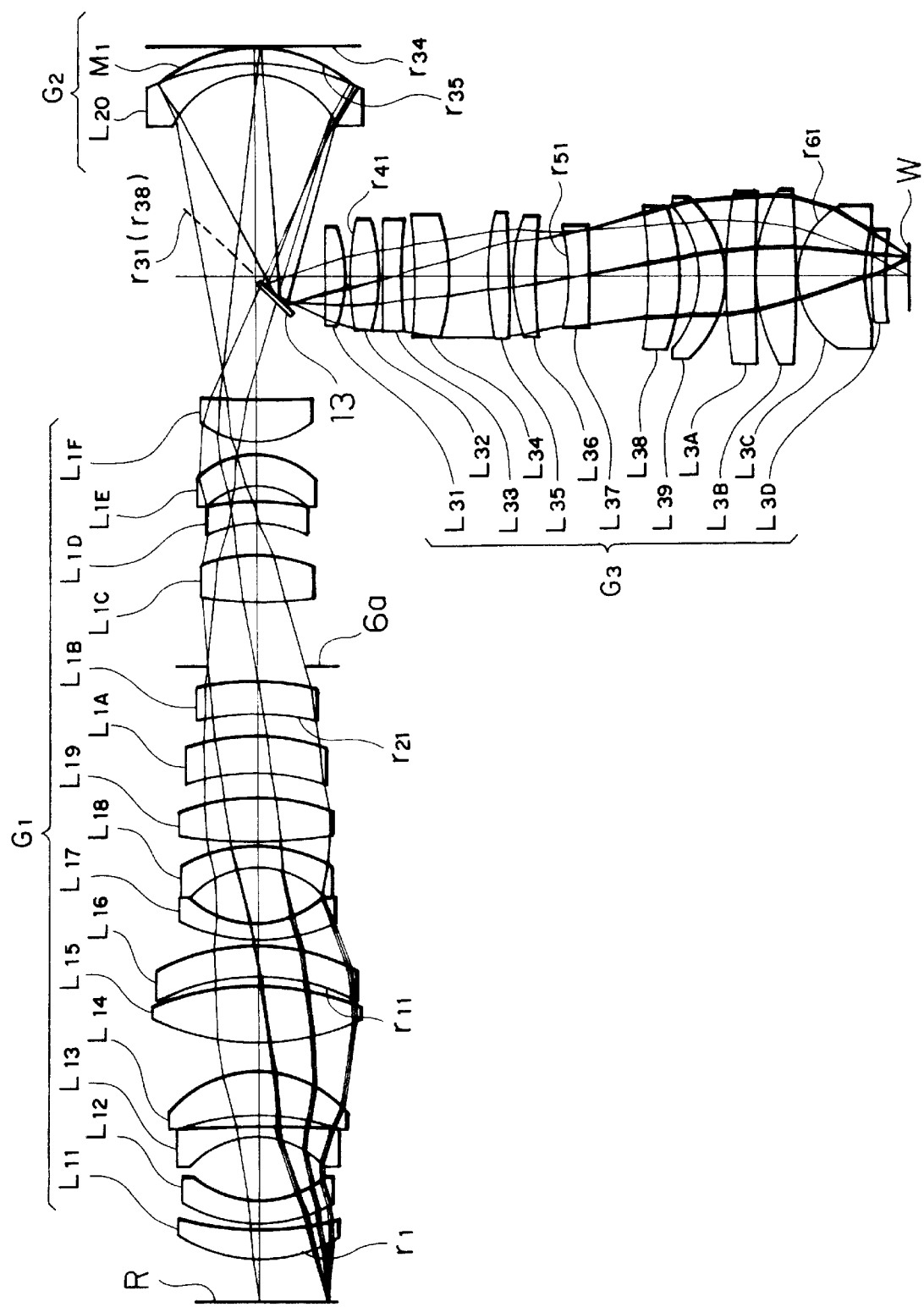
FIG. 23 is an optical path diagram showing a projection optical system according to the third embodiment of the present invention.

FIG. 23 shows the detailed lens arrangement in the third embodiment.

As shown in FIG. 23, the refracting lens group $G_1(f_1)$ is constituted by in the following order from the reticle side: a positive meniscus lens $L_{11}$ having a convex surface facing the reticle R, a negative meniscus lens $L_{12}$ having a convex surface facing the reticle R, a negative meniscus lens $L_{13}$ having a concave surface facing the reticle R, a positive meniscus lens $L_{14}$ having a concave surface facing the reticle R, a convex lens $L_{15}$, a negative meniscus lens $L_{16}$ having a concave surface facing the reticle R, a negative meniscus lens $L_{17}$ having a convex surface facing the reticle R, a negative meniscus lens $L_{18}$ having a concave surface facing the reticle R, a convex lens $L_{19}$, a positive meniscus lens $L_{1A}$ having a concave surface facing the reticle R, a positive meniscus lens $L_{1B}$ having a concave surface facing the reticle R, a convex lens $L_{1C}$, a negative meniscus lens $L_{1D}$ having a concave surface facing the reticle R, a negative meniscus lens $L_{1E}$ having a concave surface facing the reticle R, and a positive meniscus lens $L_{1F}$ having a convex surface facing the reticle R. The catadioptric lens group $G_2(f_2)$ is constituted by a negative meniscus lens $L_{20}$ having a concave surface facing the reticle R and the concave reflecting mirror $M_1$.

A refracting lens group $G_3(f_3)$ is constituted by a positive meniscus lens $L_{31}$ having a concave surface facing the reticle side (partial mirror 13), a convex lens $L_{32}$, a concave lens $L_{33}$, a positive meniscus lens $L_{34}$ having a concave surface facing the reticle R, a convex lens $L_{35}$, a positive meniscus lens $L_{36}$ having a convex surface facing the reticle R, a negative meniscus lens $L_{37}$ having a concave surface Lacing the reticle R, a positive meniscus lens $L_{38}$ having a concave surface facing the reticle R, a negative meniscus lens $L_{39}$ having a concave surface facing the reticle R, a positive meniscus lens $L_{3A}$ having a convex surface facing the reticle R, a convex lens $L_{3B}$, a positive meniscus lens $L_{3C}$ having a convex surface Lacing the reticle R, and a negative meniscus lens $L_{3D}$ having a convex surface facing the reticle R. An aperture stop 6*a* is arranged near the Fourier transform plane in the refracting lens group $G_1(f_1)$, i.e., between the positive meniscus lens $L_{1B}$ and the convex lens $L_{1C}$. A portion near the Fourier transform plane in the refracting lens group $G_3(f_3)$, i.e., the lens frame of the negative meniscus lens $L_{37}$, serves as an aperture stop.

The reduction ratio of the overall system is 1/4×, the numerical aperture (NA) on the wafer side (image side) is 0.5, and the object height is 60 mm. The width of the bar-shaped exposure region 24A on the wafer W, shown in FIG. 10, in the scanning direction is 4 mm.

One type of optical glass consisting of fused quartz is used for all the refracting lenses. The system is corrected for axial chromatic aberration and for chromatic aberration of magnification with respect to a wavelength width of 1 nm in the wavelength (193 nm) of an ultraviolet excimer laser beam. In addition, spherical aberration, coma, astigmatism, and distortion are corrected to attain an almost aberration-free state, thereby realizing an optical system having excellent imaging performance.

The curvature radii $r_i$, plane distances $d_i$, and glass materials used in the third embodiment shown in FIG. 23 are shown in Table 3. In Table 3, the 34th plane is a virtual plane indicating the reflecting surfaces of the concave reflecting mirror $M_1$.

TABLE 3

| i | $r_i$ | $d_i$ | Glass Material | i | $r_i$ | $d_i$ | Glass Material |
|---|---|---|---|---|---|---|---|
| 0 | — | 33.7 | | 33 | −198.40 | 11.1 | |
| 1 | 115.52 | 24.0 | SiO$_2$ | 34 | ∞ | 0.0 | |
| 2 | 201.62 | 3.0 | | 35 | 125.71 | 11.1 | |
| 3 | 102.72 | 21.0 | SiO$_2$ | 36 | 198.40 | 8.5 | SiO$_2$ |
| 4 | 79.03 | 54.0 | | 37 | 76.19 | 161.4 | |
| 5 | −69.98 | 9.0 | SiO$_2$ | 38 | ∞ | 55.0 | |
| 6 | −831.37 | 9.0 | | 39 | −2718.54 | 18.0 | SiO$_2$ |
| 7 | −158.10 | 36.0 | SiO$_2$ | 40 | −114.25 | 3.0 | |
| 8 | −87.19 | 24.0 | | 41 | 201.91 | 24.0 | SiO$_2$ |
| 9 | 189.29 | 48.0 | SiO$_2$ | 42 | −214.05 | 3.0 | |
| 10 | −178.69 | 7.0 | | 43 | −1582.73 | 15.0 | SiO$_2$ |
| 11 | −153.53 | 24.0 | SiO$_2$ | 44 | 309.83 | 12.0 | |
| 12 | −169.00 | 6.0 | | 45 | −337.52 | 28.2 | SiO$_2$ |
| 13 | 131.04 | 13.4 | SiO$_2$ | 46 | −156.44 | 30.4 | |
| 14 | 78.51 | 45.0 | | 47 | 225.73 | 18.0 | SiO$_2$ |
| 15 | −69.71 | 18.0 | SiO$_2$ | 48 | −1363.11 | 3.0 | |
| 16 | −117.02 | 3.0 | | 49 | 150.18 | 18.0 | SiO$_2$ |
| 17 | 303.29 | 36.1 | SiO$_2$ | 50 | 426.42 | 27.0 | |
| 18 | −172.25 | 17.6 | | 51 | −167.12 | 16.8 | SiO$_2$ |
| 19 | −174.43 | 30.0 | SiO$_2$ | 52 | −719.40 | 48.0 | |
| 20 | −156.46 | 18.0 | | 53 | −299.90 | 24.7 | SiO$_2$ |
| 21 | −206.73 | 27.0 | SiO$_2$ | 54 | −158.30 | 15.0 | |
| 22 | −177.68 | 64.8 | | 55 | −88.33 | 20.2 | SiO$_2$ |
| 23 | 275.50 | 36.0 | SiO$_2$ | 56 | −88.98 | 1.5 | |
| 24 | −127.44 | 26.8 | | 57 | 492.66 | 24.0 | SiO$_2$ |
| 25 | −84.26 | 18.0 | SiO$_2$ | 58 | 1972.64 | 1.5 | |
| 26 | −181.12 | 12.0 | | 59 | 136.67 | 30.0 | SiO$_2$ |
| 27 | −58.86 | 24.0 | SiO$_2$ | 60 | −999.05 | 1.5 | |
| 28 | −66.54 | 12.2 | | 61 | 66.31 | 54.0 | SiO$_2$ |
| 29 | 69.08 | 33.0 | SiO$_2$ | 62 | 166.17 | 4.5 | |
| 30 | 668.69 | 97.5 | | 63 | 321.60 | 11.2 | SiO$_2$ |
| 31 | ∞ | 161.4 | | 64 | 168.79 | 18.4 | |
| 32 | −76.19 | 8.5 | SiO$_2$ | | | | |

FIGS. 24 and 25 respectively show longitudinal aberration charts in the third embodiment; FIG. 24 shows an astigmatism of this embodiment; and FIG. 25 shows a distortion of this embodiment. Further, FIG. 26 shows a magnification chromatic aberration chart in the second embodiment. FIGS. 27(a), 27(b) and 27(d) show traverse aberration charts in the third embodiment.

According to the present invention, relations (1) to (6) above are preferably satisfied. The relationship between each of the above embodiments and the relations will be described below. Tables 4 to 6 respectively show the curvature radii $r$ of the concave reflecting mirror $M_1$, focal lengths $f_i$ of lens groups $G_i$ (i=1 to 3), Petzval sums $p_i$, imaging magnifications $\beta_i$, magnifications $\beta_{ij}$ of the synthetic systems of the refracting lens groups $G_1$ and the catadioptric lens group $G_2$, and magnifications $\beta_3$ of the refracting lens groups $G_3$. Note that each total system is represented by $G_T$, and a Petzval sum $p_i$ and imaging magnification $\beta$ of the total system $G_T$ are written in the columns of "Petzval Sum $p_i$" and "Imaging Magnification $\beta$" corresponding to the total system $G_T$.

TABLE 4

Specifications of first embodiment

| r | $f_i$ | $p_i$ | $n_i$ | $\beta_i$ | $\beta_{ij}$ |
|---|---|---|---|---|---|
| $G_1$ — | 1411.25 | 0.00690 | 0.10269 | −0.47409 | 0.36471 |
| $G_2$ −126.038 | 106.851 | −0.02142 | −0.43692 | −0.76928 | |
| $G_3$ — | −130.078 | 0.01462 | −0.52583 | −0.68386 | −0.68386 |
| $G_T$ — | — | 0.00010— | | −0.24941 | −0.24941 |

TABLE 5

Specifications of second embodiment

| r | $f_i$ | $p_i$ | $n_i$ | $\beta_i$ | $\beta_{ij}$ |
|---|---|---|---|---|---|
| $G_1$ — | 1421.107 | 0.00611 | 0.115168 | −0.46807 | 0.37808 |
| $G_2$ −124.838 | 110.143 | −0.02157 | −0.420914 | −0.807742 | |
| $G_3$ — | −103.285 | 0.01565 | −0.618653 | −0.66108 | −0.66108 |
| $G_T$ — | — | 0.00020— | | −0.24994 | −0.24994 |

TABLE 6

Specifications of third embodiment

| r | $f_i$ | $p_i$ | $n_i$ | $\beta_i$ | $\beta_{ij}$ |
|---|---|---|---|---|---|
| $G_1$ — | 1115.522 | 0.00680 | 0.131830 | −0.43865 | 0.34218 |
| $G_2$ −125.712 | 108.028 | −0.02172 | −0.426192 | −0.780075 | |
| $G_3$ — | −107.560 | 0.01490 | −0.623969 | −0.731048 | −0.731048 |
| $G_T$ — | — | −0.00003— | | −0.25015 | −0.25015 |

Further, based on Table 5 to Table 8, values are calculated for $(p_1+p_3)$, $p_2$, $|p_1+p_2+p_3|$, $|\beta_{12}|$, $|\beta_3|$, and $|\beta|$ in each embodiment, and the following Table 9 shows the calculated values.

TABLE 7

Table of correspondence conditions

| Conditions/Embodiment | 1 | 2 | 3 |
|---|---|---|---|
| (1) $p_1 + p_3 > 0$ | 0.02152 | 0.02176 | 0.02170 |
| (2) $p_2 < 0$ | −0.02142 | −0.02157 | −0.02172 |
| (3) $\|p_1 + p_2 + p_3\| < 0.1$ | 0.00010 | 0.00020 | 0.00003 |
| (4) $0.1 \leq \|\beta_1\| \leq 1$ | 0.47409 | 0.46807 | 0.43865 |
| (5) $0.5 \leq \|\beta_2\| \leq 2$ | 0.76928 | 0.80774 | 0.780075 |
| (6) $0.25 \leq \|\beta_3\| \leq 1.5$ | 0.68386 | 0.66108 | 0.731048 |

As is apparent from the above tables, relations (1) to (6) given above are satisfied in each of the above embodiments.

In each embodiment described above, as the half mirror, a compact mirror covering a half portion of the optical axis is used. However, as the half mirror, a partial reflecting mirror constituted by a large glass plate and having a reflecting film formed on only one surface side of the optical axis may be used. Alternatively, as the half mirror, a prism type beam splitter having a reflecting film formed on only, e.g., the lower half portion of the joined surface serving as a reflecting surface may be used.

In each embodiment described above, quartz is used as a glass material for a refracting optical system. However, optical glass such as fluorite may be used.

Figure 28:
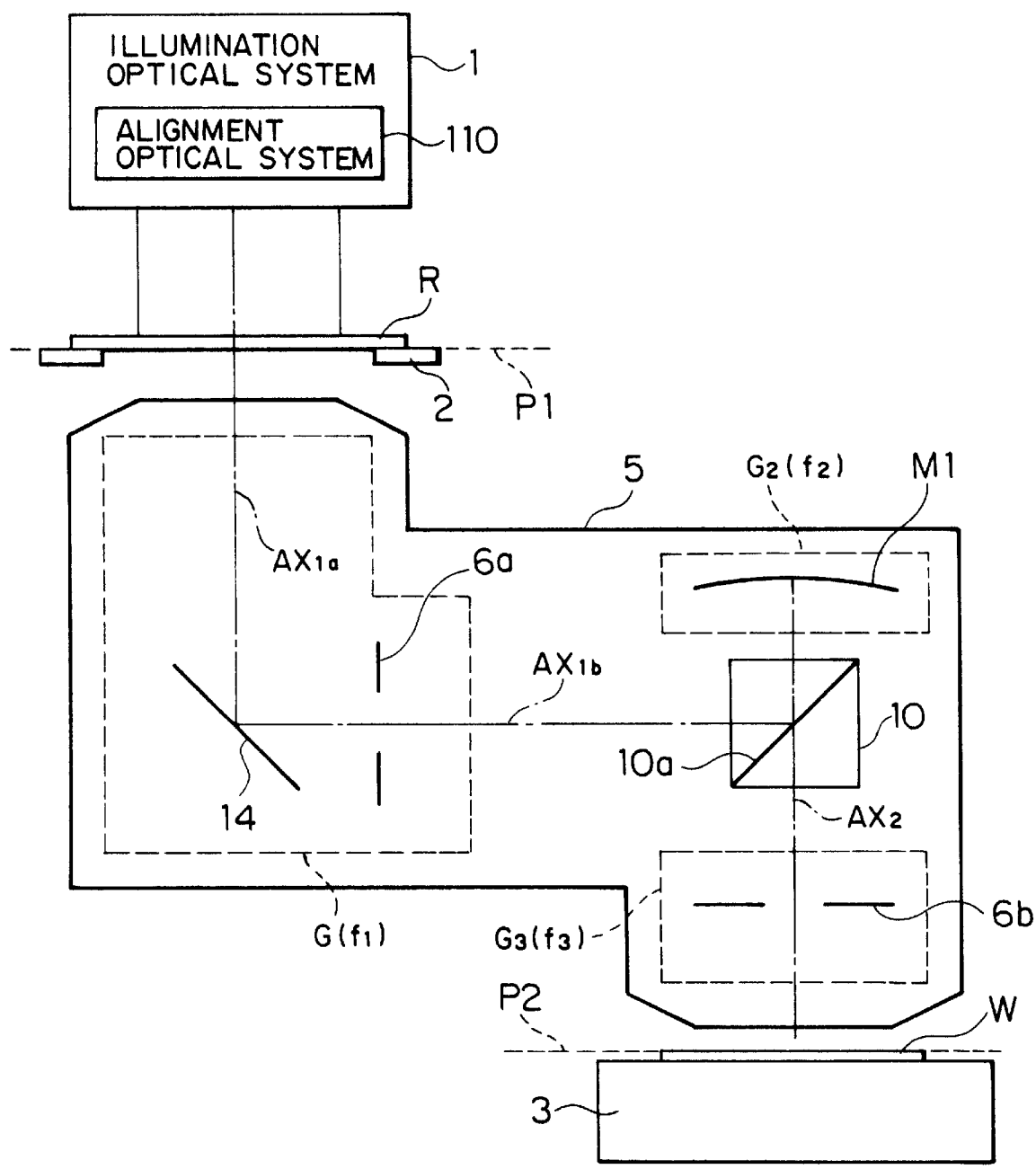
FIG. 28 shows a schematic structure of an exposure apparatus of a one-shot method using a catadioptric reduction projection optical system according to the present invention.

Next, an embodiment of a common exposure apparatus using the catadioptric reduction projection optical system 5 of the present invention. In this embodiment, as shown in FIG. 28, the first refracting lens group $G_1(f_1)$ includes a reflector 14 changing a traveling direction of light that travels in the first refracting lens group $G_1(f_1)$. Therefore, the optical axis AX1 of the first refracting lens group $G_1$ is constituted by optical axes AX1*a* and AX1*b* as shown in FIG. 28. The techniques relating to an exposure apparatus using a catadioptric projection optical system is described, for example, in Japanese Laid-Open Patent Application No. 5-72478, or the like.

As described above, the present invention is not limited to the above embodiments. Various changes and modifications of the embodiments can be made without departing from the spirit and scope of the present invention.

According to the present invention, the primary imaging operation is performed between the first surface (object surface) and the concave reflecting mirror, and the secondary imaging operation is performed between the concave reflecting mirror and the second surface (image plane). For this reason, the beam splitting means for splitting a light beam incident on the concave reflecting mirror from a light beam reflected thereby can be reduced in size. In addition, since an image formed by the secondary imaging operation is relayed to the second surface via the third imaging optical system, the optical path from the concave reflecting mirror and the image plane can be set to be sufficiently long, and the working distance can be increased. Furthermore, since the imaging magnification of the first imaging optical system can be arbitrarily changed within a predetermined range, excellent optical performance can be realized.

An aperture stop can be arranged in the first or third imaging optical system (or both). For this reason, the coherent factor (σ value) can be arbitrarily controlled.

In the conventional catadioptric optical system, since the optical axis is decentered, an adjusting operation is difficult to perform. It is, therefore, difficult to realize designed imaging performance. However, in the catadioptric reduction projection optical system of the present invention, since the optical path can be deflected near the first or second intermediate image, the adverse effect of any decentering error on the imaging characteristics is small. In addition, for example, when the optical path is to be deflected near the second intermediate image, the first and second imaging optical system are integrated into one system, and this system and the third imaging optical system can be independently adjusted. After this adjustment, the two optical systems are arranged such that their optical axes are almost perpendicular to each other. Therefore, decentering adjustment and the like can be easily performed.

When a prism type beam splitter is to be used as a beam splitting means, since a compact prism type beam splitter can be used, a deterioration in imaging characteristics due to nonuniform characteristics at the half-transmitting surface of the beam splitter can be reduced. In addition, the blanket wafer exposure scheme can be used with a large numerical aperture unlike a ring field optical system for projecting only an annular zone by using an off-axis beam.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 198350/1994 filed on Aug. 23, 1994 is hereby incorporated by reference.

What is claimed is:

1. A catadioptric reduction projection optical system for projecting a reduced image of a pattern of a first surface onto a second surface, comprising:

a first imaging optical system having a positive refractive power and for forming a first intermediate image as a reduced image of the pattern on the first surface;

beam splitting means for splitting at least part of a light beam from said first imaging optical system;

a second imaging optical system including a concave reflecting mirror for reflecting a light beam split by said beam splitting means, said second imaging optical system having a positive refractive power and for forming a second intermediate image as an image of the first intermediate image; and a third imaging optical system for forming a third intermediate image as an image of the second intermediate image on the second surface on the basis of a light beam, of a light beam from said second imaging optical system, which is split by said beam splitting means.

2. A system according to claim 1, wherein said beam splitting means is a prism type beam splitter, and at least one of the first intermediate image and the second intermediate image is formed in said prism type beam splitter.

3. A system according to claim 2, wherein an optical axis of said first imaging optical system corresponds to an optical axis of said second imaging optical system, and said beam splitting means is disposed between said first imaging optical system and said second imaging optical system.

4. A system according to claim 2, wherein an optical axis of said second imaging optical system corresponds to an optical axis of said third imaging optical system, and said beam splitting means is disposed between said second imaging optical system and said third imaging optical system.

5. A system according to claim 1, wherein said beam splitting means is a partial reflecting mirror for partially reflecting a light beam, and the second intermediate image is formed between said beam splitting means and said concave reflecting mirror of said second imaging optical system.

6. A system according to claim 5, wherein said partial reflecting mirror is disposed so as to avoid optical axes of said first and third imaging optical systems.

7. A system according to claim 1, wherein the following conditions are satisfied:

$$p_1+p_3>0, p_2<0,$$

and $$|p_1+p_2+p_3|<0.1$$

where $p_1$ is the Petzval sum of said first imaging optical system, $p_2$ is the Petzval sum of said second imaging optical system, and $p_3$ is the Petzval sum of said third imaging optical system, and the following conditions are satisfied:

$$0.1 \leq |\beta_1| \leq 1,$$

$$0.5 \leq |\beta_2| \leq 2,$$

$$0.25 \leq |\beta_3| \leq 1.5, \text{ and}$$

$$|\beta_1 \cdot \beta_2 \cdot \beta_3|<1$$

where $\beta_1$ is the magnification between the pattern of the first surface and the first intermediate image, $\beta_2$ is the magnification between the first intermediate image and the second intermediate image, and $\beta_3$ is the magnification between the second intermediate image and the third intermediate image.

8. An exposure apparatus comprising:

a first stage allowing a photosensitive substrate to be held on a main surface thereof;

a second stage for supporting a mask on which a predetermined pattern is formed;

an illumination optical system for emitting exposure light of a predetermined wavelength and transferring the pattern of the mask onto the substrate; and a catadioptric reduction projection optical system provided between said first stage and said second stage, for projecting a reduced image of the pattern of the mask onto the substrate, said catadioptric reduction projection optical system including:

a first imaging optical system having a positive refractive power and for forming a first intermediate image as a reduced image of the pattern on the mask;

beam splitting means for splitting at least part of a light beam from said first imaging optical system;

a second imaging optical system including a concave reflecting mirror for reflecting a light beam split by said beam splitting means, and for forming a second intermediate image as an image of the first intermediate image; and a third imaging optical system for forming a third intermediate image as an image of the second intermediate image on the substrate on the basis of a light beam, of a light beam from said second imaging optical system, which is split by said beam splitting means.

9. An apparatus according to claim 8, wherein said beam splitting means is a prism type beam splitter, and at least one of the first intermediate image and the second intermediate image is formed in said prism type beam splitter.

10. An apparatus according to claim 9, wherein an optical axis of said first imaging optical system corresponds to an optical axis of said second imaging optical system, and said beam splitting means is disposed between said first imaging optical system and said second imaging optical system.

11. An apparatus according to claim 9, wherein an optical axis of said second imaging optical system corresponds to an optical axis of said third imaging optical system, and said beam splitting means is disposed between said second imaging optical system and said third imaging optical system.

12. An apparatus according to claim 8, wherein said beam splitting means is a partial reflecting mirror for partially reflecting a light beam, and the second intermediate image is formed between said beam splitting means and said concave reflecting mirror of said second imaging optical system.

13. An apparatus according to claim 12, wherein said partial reflecting mirror is disposed so as to avoid optical axes of said first and third imaging optical systems.

14. An apparatus according to claim 8, wherein the following conditions are satisfied:

$$p_1+p_3>0, p_2<0,$$

and $$|p_1+p_2+p_3|<0.1$$

where $p_1$ is the Petzval sum of said first imaging optical system, $p_2$ is the Petzval sum of said second imaging optical system, and $p_3$ is the Petzval sum of said third imaging optical system, and the following conditions are satisfied:

$$0.1 \leq |\beta_1| \leq 1,$$

$$0.5 \leq |\beta_2| \leq 2,$$

$$0.25 \leq |\beta_3| \leq 1.5, \text{ and}$$

$$|\beta_1 \cdot \beta_2 \cdot \beta_3| < 1$$

where $\beta_1$ is the magnification between the pattern of the first surface and the first intermediate image, $\beta_2$ is the magnification between the first intermediate image and the second intermediate image, and $\beta_3$ is the magnification between the second intermediate image and the third intermediate image.

* * * * *